United States Patent
Hirano et al.

(10) Patent No.: US 10,265,775 B2
(45) Date of Patent: Apr. 23, 2019

(54) COATED TOOL

(71) Applicant: TUNGALOY CORPORATION, Fukushima (JP)

(72) Inventors: Yusuke Hirano, Iwaki (JP); Kenji Metoki, Iwaki (JP)

(73) Assignee: TUNGALOY CORPORATION, Iwaki-Shi, Fukushima (JP)

( * ) Notice: Subject to any disclaimer, the term of this patent is extended or adjusted under 35 U.S.C. 154(b) by 13 days.

(21) Appl. No.: 15/128,662

(22) PCT Filed: Mar. 27, 2015

(86) PCT No.: PCT/JP2015/059553
§ 371 (c)(1),
(2) Date: Sep. 23, 2016

(87) PCT Pub. No.: WO2015/147241
PCT Pub. Date: Oct. 1, 2015

(65) Prior Publication Data
US 2018/0071829 A1 Mar. 15, 2018

(30) Foreign Application Priority Data
Mar. 27, 2014 (JP) .................. 2014-064910

(51) Int. Cl.
*B32B 9/00* (2006.01)
*B23B 27/14* (2006.01)
(Continued)

(52) U.S. Cl.
CPC .......... *B23B 27/14* (2013.01); *C23C 14/0641* (2013.01); *C23C 28/042* (2013.01);
(Continued)

(58) Field of Classification Search
None
See application file for complete search history.

(56) References Cited

U.S. PATENT DOCUMENTS

| 7,923,130 B2 | 4/2011 | Shibata et al. |
| 2009/0155559 A1 | 6/2009 | Xu et al. |

(Continued)

FOREIGN PATENT DOCUMENTS

| EP | 2 700 460 A1 | 2/2014 |
| JP | H-07205361 | 8/1995 |

(Continued)

OTHER PUBLICATIONS

Extended European Search Report in corresponding application No. 15768527.2 dated Oct. 2, 2017.
(Continued)

*Primary Examiner* — David Sample
*Assistant Examiner* — Mary I Omori
(74) *Attorney, Agent, or Firm* — Foley & Lardner LLP

(57) ABSTRACT

A coated tool includes a substrate and a coating layer having a plurality of first laminated structures alternated with a plurality of second laminated structures. Each of the first laminated structures and each of the second laminated structures contains at least two kinds of layers having different composition and alternately laminated twice or more. An average thickness of the layers contained in the first laminated structure is between 60 nm and 500 nm, while an average thickness of the layers contained in the second laminated structure is between 2 nm and 60 nm. Each of the layers within the laminated structures include at least one metal element and at least one non-metal element selected from among carbon, nitrogen, oxygen and boron. An average thickness of the first laminated structure and/or the second laminated structure decreases with increasing distance from the substrate.

6 Claims, 1 Drawing Sheet

(51) Int. Cl.
    *C23C 14/06*      (2006.01)
    *C23C 30/00*      (2006.01)
    *C23C 28/04*      (2006.01)
    *C23C 28/00*      (2006.01)
    *C23C 14/32*      (2006.01)

(52) U.S. Cl.
    CPC ............ *C23C 28/044* (2013.01); *C23C 28/42* (2013.01); *C23C 28/44* (2013.01); *C23C 30/005* (2013.01); *B23B 2228/105* (2013.01); *C23C 14/325* (2013.01)

(56) References Cited

U.S. PATENT DOCUMENTS

| | | | |
|---|---|---|---|
| 2010/0215951 A1* | 8/2010 | Shibata | C23C 28/042 428/336 |
| 2013/0052477 A1* | 2/2013 | Lechthaler | C23C 14/0641 428/623 |
| 2015/0203956 A1 | 7/2015 | Asari et al. | |

FOREIGN PATENT DOCUMENTS

| | | | |
|---|---|---|---|
| JP | 2003-200306 | 7/2003 | |
| JP | 2010-099769 | 5/2010 | |
| JP | 2010-188461 | 9/2010 | |
| JP | 2011-104687 | 6/2011 | |
| JP | 2011-104722 | 6/2011 | |
| WO | WO-2014025057 A1 * | 2/2014 | ........... C23C 30/005 |

OTHER PUBLICATIONS

International Search Report dated Jun. 23, 2015 issued in counterpart International (PCT) Application (No. PCT/JP2015/059553).

Written Opinion dated Jun. 23, 2015 issued in counterpart International (PCT) Application (No. PCT/JP2015/059553).

Japanese Patent Office, "Notification of Reasons for Refusal," issued in connection with Japanese Patent Application No. 2016-510518, dated Apr. 3, 2018.

\* cited by examiner

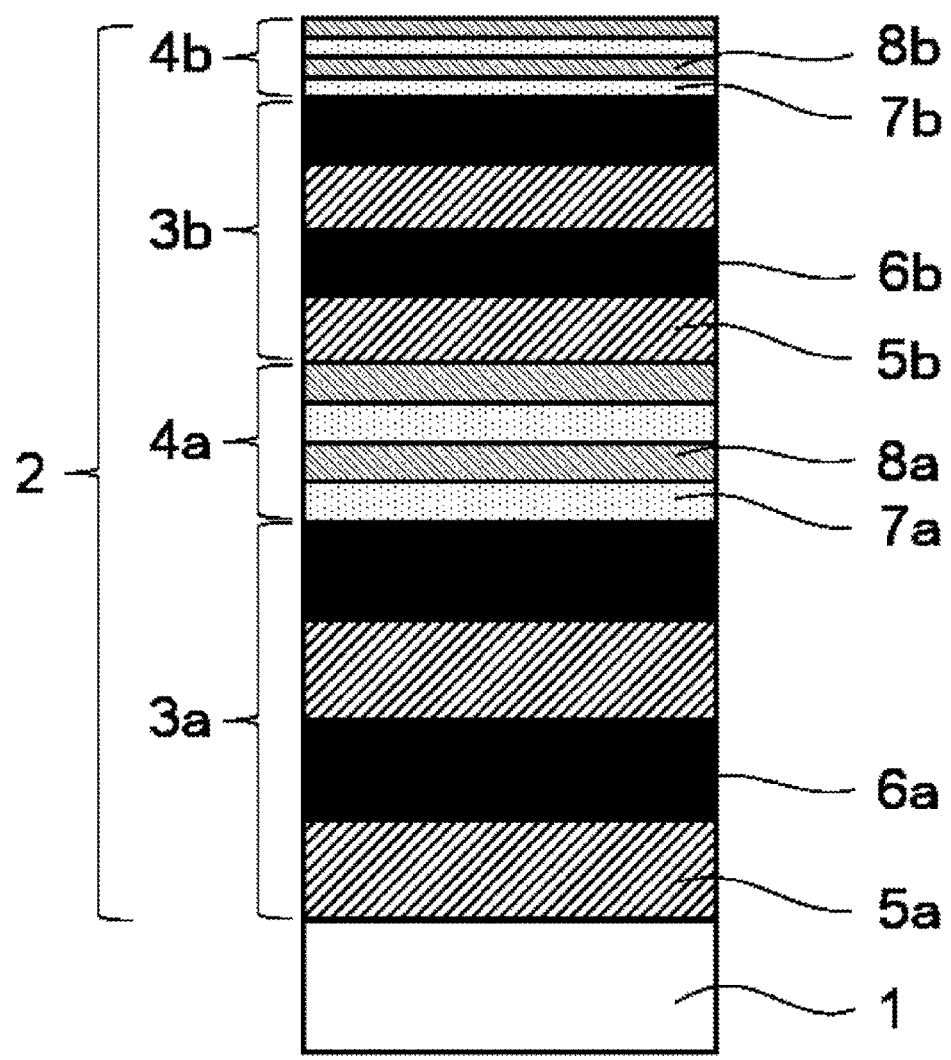

COATED TOOL

RELATED APPLICATIONS

This is a 371 US National Phase of International Patent Application No. PCT/JP2015/059553 filed Mar. 27, 2015, and published as WO 2015/147241A1 on Oct. 1, 2015, which claims priority to JP 2014-064910, filed Mar. 27, 2014. The contents of the aforementioned applications are incorporated by reference in their entirety.

TECHNICAL FIELD

The present invention relates to a coated tool.

BACKGROUND ART

In recent years, cutting with high efficiency has been highly demanded. Accompanying with heightening of this demand, a cutting tool having a longer tool life than that of the conventional ones has been required. Thus, as characteristics required for the tool materials, it is important to improve characteristics relating to lifetime of a cutting tool. For example, it is more important to improve wear resistance and fracture resistance of the cutting tool. To improve these characteristics, a coated tool wherein alternately laminated films in which coating films are alternately laminated are formed on a substrate has been used.

To improve characteristics of such alternately laminated films, various techniques have been proposed. In Patent document 1, for example, a cutting tool in which a specific metal element or a compound thereof, and a specific alloy compound are laminated onto a surface of a base material with laminating cycles of 0.4 nm to 50 nm has been proposed. It has been disclosed that the cutting tool shows excellent wear resistance.

In Patent document 2, a cutting tool in which a first layer and a second layer are alternately laminated on a substrate so that these layers become 4 layers or more has been proposed. The first layer contains a complex nitride represented by the compositional formula of $(Ti_{1-X}Al_X)N$ (X: 0.30 to 0.70 in an atomic ratio). The second layer contains an aluminum oxide phase and a titanium nitride phase. A ratio of the aluminum oxide phase in the second layer is 35 to 65% by mass based on the total of the aluminum oxide phase and the titanium nitride phase. Average thicknesses of the first layer and the second layer are each 0.2 to 1 μm. An average thickness of the first layer and the second layer in total is 2 to 10 μm. It has been disclosed that the cutting tool has excellent wear resistance.

In Patent document 3, a coated tool containing a first laminated structure and a second laminated structure has been proposed. The first laminated structure has a structure in which two or more layers having different compositions are periodically laminated. The average thickness of the respective layers contained in the first laminated structure is 60 nm or more and 500 nm or less. The second laminated structure has a structure in which two or more layers having different compositions are periodically laminated. The average thickness of the respective layers contained in the second laminated structure is 2 nm or more and less than 60 nm.

PRIOR ART DOCUMENT

Patent Document

Patent document 1: JP Hei.7-205361A
Patent document 2: JP 2003-200306A
Patent document 3: WO 2014/025057A

SUMMARY OF THE INVENTION

Problems to be Solved by the Invention

In recent years, high speed, high feeding and deep cutting in a cutting process becomes more remarkable. Thus, fracture of the tool has been frequently generated. For example, due to the load applied to the cutting edge during the processing, cracks are generated at the surface of the tool. By propagating the cracks to the substrate, fracture of the tool is generated. In addition, if a temperature of the cutting edge is rapidly raised or lowered, cracks are generated at the substrate. By propagating the cracks to the coating layer, fracture of the tool is generated.

According to such a background, the cutting tool disclosed in the above-mentioned Patent document 1 has high wear resistance, but has a problem that fracture of the tool is likely generated. The cutting tool disclosed in Patent document 2 has a problem that wear resistance is poor since hardness of the film is insufficient. The cutting tool disclosed in Patent document 3 cannot fulfil the required properties since fracture resistance is insufficient.

The present invention has been done to solve these problems. An object of the present invention is to improve fracture resistance without lowering wear resistance of a coated tool. In addition, an object of the present invention is to provide a coated tool having long tool life.

Means to Solve the Problems

The present inventors have intensively researched on elongation of tool life of a coated tool. The present inventors have accomplished improvement in fracture resistance without lowering wear resistance of the coated tool by improving a constitution of the coating layer. As a result, tool life of the coated tool could be elongated.

That is, the summary of the present invention is as follows.

(1) A coated tool which comprises a substrate, and
a coating layer formed onto a surface of the substrate,
wherein the coating layer contains a first laminated structure and a second laminated structure,
the first laminated structure and the second laminated structure are laminated alternately and continuously twice or more,
the first laminated structure contains at least two kinds of layers having different compositions, and the two kinds of the layers are alternately laminated twice or more,
an average layer thickness of the layers contained in the first laminated structure is 60 nm or more and 500 nm or less,
the second laminated structure contains at least two kinds of layers having different compositions, and the two kinds of the layers are alternately laminated twice or more,
an average layer thickness of the layers contained in the second laminated structure is 2 nm or more and less than 60 nm,
the layers contained in the first laminated structure and the second laminated structure contain a compound which contains at least one metal element selected from the group consisting of Ti, Zr, Hf, V, Nb, Ta, Cr, Mo, W, Al, Si, Sr, Y, Sn and Bi, and at least one non-metal element selected from the group consisting of carbon, nitrogen, oxygen and boron, an average thickness(es) of the first laminated structure and/or the second laminated structure is/are continuously or stepwisely reduced from the substrate side toward a surface side of the coating layer.

(2) The coated tool according to (1), wherein an average thickness of the first laminated structure is 0.2 μm or more and 6 μm or less.
(3) The coated tool according to (1) or (2), wherein an average thickness of the second laminated structure is 0.02 μm or more and 6 μm or less.
(4) The coated tool according to any one of (1) to (3), wherein an average thickness of the whole coating layer is 0.22 μm or more and 12 μm or less.
(5) The coated tool according to any one of (1) to (4), wherein when an average thickness of the first laminated structure nearest to the surface of the coating layer is made TA1, and an average thickness of the first laminated structure nearest to the substrate is made TB1, then a ratio of TA1 to TB1 is 5% or more and 50% or less.
(6) The coated tool according to any one of (1) to (5), wherein when an average thickness of the second laminated structure nearest to the surface of the coating layer is made TA2, and an average thickness of the second laminated structure nearest to the substrate is made TB2, then a ratio of TA2 to TB2 is 5% or more and 50% or less.
(7) The coated tool according to any one of (1) to (6), wherein when an average thickness of the layers contained in the first laminated structure nearest to the surface of the coating layer is made TC1, and an average thickness of the layers contained in the first laminated structure nearest to the substrate is made TD1, then a ratio of TC1 to TD1 is 12% or more and 70% or less.
(8) The coated tool according to any one of (1) to (7), wherein when an average thickness of the layers contained in the second laminated structure nearest to the surface of the coating layer is made TC2, and an average thickness of the layers contained in the second laminated structure nearest to the substrate is made TD2, then a ratio of TC2 to TD2 is 5% or more and 70% or less.
(9) The coated tool according to any one of (1) to (8), wherein the layers contained in the first laminated structure and the layers contained in the second laminated structure contain a compound comprising at least two metal elements selected from the group consisting of Ti, Nb, Ta, Cr, W, Al, Si, Sr and Y, and at least one non-metal element selected from the group consisting of carbon, nitrogen, oxygen and boron.

Effects of the Invention

The coated tool of the present invention is excellent in wear resistance and fracture resistance, so that it can accomplish the effect that tool life can be elongated than those of the conventional ones.

BRIEF DESCRIPTION OF THE DRAWING

FIG. 1 is an example of a schematic drawing of a cross-sectional structure of the coated tool of the present invention.

EMBODIMENT TO CARRY OUT THE INVENTION

The coated tool of the present invention comprises a substrate and a coating layer formed onto a surface of the substrate. The substrate of the present invention may be any material so long as it is used as a substrate of the coated tool. The substrate of the present invention is not particularly limited and may be, for example, a cemented carbide, cermet, ceramics, a cubic boron nitride sintered body, a diamond sintered body and high-speed steel. Among these materials, a cemented carbide is preferred. This is because the cemented carbide is excellent in wear resistance and fracture resistance.

In the coated tool of the present invention, an average thickness of the whole coating layer is preferably 0.22 to 12 μm. If the average thickness of the coating layer is less than 0.22 μm, wear resistance of the coated tool tends to be lowered. If the average thickness of the coating layer exceeds 12 μm, fracture resistance of the coated tool tends to be lowered. The average thickness of the whole coating layer is further preferably 1.0 to 8.0 μm.

In the coated tool of the present invention, the coating layer contains a specific first laminated structure and second laminated structure. The respective layers contained in the first laminated structure and the second laminated structure contain a compound comprising at least one metal element selected from the group consisting of Ti, Zr, Hf, V, Nb, Ta, Cr, Mo, W, Al, Si, Sr, Y, Sn and Bi, and at least one non-metal element selected from the group consisting of carbon, nitrogen, oxygen and boron. The coated tool of the present invention is excellent in wear resistance.

The layers contained in the first laminated structure and the second laminated structure more preferably contain a compound comprising at least two kinds of metal elements selected from the group consisting of Ti, Nb, Ta, Cr, W, Al, Si, Sr and Y, and at least one non-metal element selected from the group consisting of carbon, nitrogen, oxygen and boron. This is because such a compound has a property of being hard. The compound contained in the layer constituting the first laminated structure may be specifically $(Al_{0.50}Ti_{0.50})N$, $(Al_{0.60}Ti_{0.40})N$, $(Al_{0.67}Ti_{0.33})N$, $(Al_{0.67}Ti_{0.33})CN$, $(Al_{0.45}Ti_{0.45}Si_{0.10})N$, $(Al_{0.45}Ti_{0.45}Y_{0.10})N$, $(Al_{0.50}Ti_{0.30}Cr_{0.20})N$, $(Al_{0.50}Ti_{0.45}Nb_{0.05})N$, $(Al_{0.50}Ti_{0.45}Ta_{0.05})N$, $(Al_{0.50}Ti_{0.45}W_{0.05})N$, $(Ti_{0.90}Si_{0.10})N$, $(Al_{0.50}Cr_{0.50})N$, etc.

The metal element(s) contained in the layer constituting the first laminated structure is/are preferably the same as the metal element(s) contained in the other layers constituting the first laminated structure. That is, a plurality of the layers constituting the first laminated structure are preferably constituted by the same kinds of the metal elements. In addition, it is preferred that an absolute value of the difference between a ratio of the specific metal elements contained in a layer constituting the first laminated structure and a ratio of the specific metal elements contained in the other layer constituting the first laminated structure adjacent to the above layer is 5 atomic % or more. "A ratio of the specific metal elements" herein mentioned means a ratio (atomic %) of the number of the atoms of the specific metal elements contained in the layer based on the number of atoms of the whole metal elements contained in the layer.

If the first laminated structure employs such a constitution, crystal lattice becomes inconsistent at the boundary surface between the layers without lowering adhesiveness between a layer constituting the first laminated structure and a layer adjacent to the layer. Therefore, cracks are likely propagated to the direction parallel to the boundary surface of the layers constituting the first laminated structure, whereby propagation of the cracks to the substrate can be effectively suppressed.

With regard to the above-mentioned "absolute value of the difference between a ratio of the specific metal elements contained in a layer and a ratio of the specific metal elements contained in the other layers adjacent to the above layer is 5 atomic % or more", it is explained in more detail.

For example, when the first laminated structure is constituted by an $(Al_{0.55}Ti_{0.45})N$ layer and an $(Al_{0.67}Ti_{0.33})N$ layer, the kinds of the metal elements contained in the two layers are the same. This is because the two layers both contain Al and Ti. In this case, the number of the atoms of Al contained in the $(Al_{0.55}Ti_{0.45})N$ layer is 55 atomic % based on the number of the atoms of the whole metal elements. The number of the atoms of Al contained in the $(Al_{0.67}Ti_{0.33})N$ layer is 67 atomic % based on the number of the atoms of the whole metal elements. The difference in the ratios of the numbers of the atoms of Al in these two layers is 12 atomic %. Accordingly, in this case, the above-mentioned condition that "the absolute value of the difference is 5 atomic % or more" is satisfied.

For example, when the first laminated structure is constituted by a $(Al_{0.49}Ti_{0.39}Cr_{0.12})N$ layer and a $(Al_{0.56}Ti_{0.36}Cr_{0.08})N$ layer, the kinds of the metal elements contained in the two layers are the same. This is because the two layers both contain Al, Ti and Cr. In this case, the difference in the ratios of the numbers of the atoms of Ti contained in the two layers is 3 atomic %. The difference in the ratios of the numbers of the atoms of Cr contained in the two layers is 4 atomic %. These values are each less than 5 atomic %. However, even in this case, the difference in the ratios of the numbers of the atoms of Al contained in the two layers is 7 atomic %, so that the above-mentioned condition that "an absolute value of the difference is 5 atomic % or more" is satisfied.

In the present specification, when the nitride is shown as $(M_a L_b)N$, it means that an atomic ratio of the M element based on the whole metal elements is a, and an atomic ratio of the L element based on the whole metal elements is b. For example, $(Al_{0.55}Ti_{0.45})N$ means that an atomic ratio of the Al element based on the whole metal elements is 0.55, and an atomic ratio of the Ti element based on the whole metal elements is 0.45. That is, $(Al_{0.55}Ti_{0.45})N$ shows that an amount of the Al element based on the whole metal element is 55 atomic %, and an amount of the Ti element based on the whole metal element is 45 atomic %.

The metal element(s) contained in the layers constituting the second laminated structure is/are preferably the same as the metal element(s) contained in the other layers constituting the second laminated structure. That is, a plurality of the layers constituting the second laminated structure are preferably constituted by the same kinds of the metal elements. In addition, it is preferred that an absolute value of the difference between a ratio of the specific metal elements contained in a layer constituting the second laminated structure and a ratio of the specific metal elements contained in the other layer constituting the second laminated structure adjacent to the above layer is 5 atomic % or more. "A ratio of the specific metal elements" herein mentioned means a ratio (atomic %) of the number of the atoms of the specific metal elements contained in the layer based on the number of atoms of the whole metal elements contained in the layer.

If the second laminated structure employs such a constitution, crystal lattice becomes inconsistent at the boundary surface between the layers without lowering adhesiveness between a layer constituting the second laminated structure and a layer adjacent to the layer. Therefore, cracks are likely propagated to the direction parallel to the boundary surface of the layers constituting the second laminated structure, whereby propagation of the cracks to the substrate can be effectively suppressed. The meaning of the above-mentioned "absolute value of the difference between a ratio of the specific metal elements contained in a layer and a ratio of the specific metal elements contained in the other layers adjacent to the above layer is 5 atomic % or more" is the same as those explained in the above first laminated structure.

As the other embodiments of the coated tool of the present invention, it is preferred that one or more kinds of the metal elements contained in a layer constituting the first laminated structure is different from the metal elements contained in the other layer constituting the first laminated structure adjacent to the above layer. If one or more kinds of the metal elements is/are different, crystal lattice becomes inconsistent at the boundary surface between the layers, and cracks are likely propagated to the direction parallel to the boundary surface of the layers, whereby propagation of the cracks to the substrate can be effectively suppressed.

For example, when the first laminated structure is constituted by an $(Al_{0.50}Ti_{0.50})N$ layer and an $(Al_{0.50}Ti_{0.30}Cr_{0.20})N$ layer, and the metal elements contained in the two layers are compared to each other, the above condition is satisfied. This is because the two layers contains Al and Ti, but Cr is contained in one layer alone.

For example, when the first laminated structure is constituted by an $(Al_{0.50}Cr_{0.50})N$ layer and an $(Al_{0.67}Ti_{0.33})N$ layer, and the metal elements contained in the two layers are compared to each other, the above condition is satisfied. This is because the two layers contains Al, but Cr and Ti are respectively contained in one layer alone.

Similarly, in the coated tool of the present invention, it is preferred that one or more kinds of the metal elements contained in a layer constituting the second laminated structure is different from the metal elements contained in the other layers constituting the second laminated structure adjacent to the above layer. If one or more kinds of the metal elements is/are different, crystal lattice becomes inconsistent at the boundary surface between the layers, and cracks are likely propagated to the direction parallel to the boundary surface of the layers, whereby propagation of the cracks to the substrate can be effectively suppressed.

The coated tool of the present invention contains a coating layer. The coating layer contains a first laminated structure. The first laminated structure contains two or more layers comprising the above-mentioned compound. The average thickness of the respective layers contained in the first laminated structure is 60 nm or more and 500 nm or less. Two or more layers contained in the first laminated structure are periodically laminated. The periodically laminated structure contains at least two kinds of layers having different compositions. These two kinds of layers are preferably laminated alternately twice or more. When two kinds of layers having different compositions are laminated alternately twice or more, propagation of the cracks is suppressed, so that fracture resistance of the coated tool is further improved.

In the present invention, the minimum unit of the thickness in which lamination of the layers is repeated is called as "laminating cycle".

FIG. 1 is an example of a schematic drawing of a cross-sectional structure of the coated tool of the present invention. In the following, the laminating cycle is explained by referring to FIG. 1.

For example, Layer A1, Layer B1, Layer C1 and Layer D1 which have different compositions are repeatedly laminated from the substrate (1) toward the surface of the coating layer (2). More specifically, these layers are laminated in the order of Layer A1→Layer B1→Layer C1→Layer D1→Layer A1→Layer B 1→Layer C1→Layer D1→ . . . . In this case, the total thickness from Layer A1 to Layer D1 is a "laminating cycle".

For example, Layer A1 and Layer B1 which have different compositions are repeatedly laminated from the substrate (1) toward the surface of the coating layer (2). More specifically, these layers are laminated in the order of Layer A1→Layer B1→Layer A2→Layer B1→Layer A1→Layer B1→ . . . . In this case, the total of the thickness of Layer A1 and the thickness of Layer B1 is a "laminating cycle".

To form the first laminated structure, at least two kinds of layers having different compositions are periodically laminated. The average thickness of the respective layers is 60 nm or more and 500 nm or less. By being formed the first laminated structure as mentioned above, the following effects can be obtained.

Cracks generated at the surface of the coating layer during the use of the coated tool reach to the first laminated structure. The cracks reached to the first laminated structure propagate to the direction parallel to the boundary surface of the layers having different compositions. This brings an effect that the propagation of the cracks to the substrate can be prevented. Such an effect can be more heightened by alternately laminating two layers having different compositions twice or more. More specifically, it is preferred that Layer A1 and Layer B1 having different compositions are alternately laminated twice or more from the substrate toward the surface of the coating layer. That is, the first laminated structure preferably contains an alternately laminated structure of Layer A1→Layer B1→Layer A1→Layer B1→ . . . .

If the average thickness of the respective layers contained in the first laminated structure is less than 60 nm, propagation of the cracks to the substrate cannot sufficiently be prevented. On the other hand, if the average thickness of the respective layers exceeds 500 nm, fracture resistance of the coated tool is lowered. Therefore, the average thickness of the respective layers contained in the first laminated structure is 60 nm or more and 500 nm or less. The average thickness of the respective layers contained in the first laminated structure is preferably 60 nm or more and 250 nm or less.

If the average thickness of the first laminated structure is less than 0.2 μm, a number (a number of repeated times) of periodically laminating the layers having different compositions becomes small. In this case, the effect of suppressing propagation of cracks to the substrate is lowered. On the other hand, if the average thickness of the first laminated structure exceeds 6 μm, residual compressive stress of the whole coating layer becomes high. As a result, peeling or fracture of the coating layer likely occurs, whereby fracture resistance of the coated tool is lowered. Accordingly, the average thickness of the first laminated structure is preferably 0.2 to 6 μm.

The coated tool of the present invention contains a coating layer. The coating layer contains a second laminated structure. The second laminated structure contains two or more layers comprising the above-mentioned compound. The average thickness of the respective layers contained in the second laminated structure is 2 nm or more and less than 60 nm. Two or more layers contained in the second laminated structure are periodically laminated. The periodically laminated structure contains at least two kinds of layers having different compositions. These two kinds of layers are preferably laminated alternately twice or more. When two kinds of layers having different compositions are laminated alternately twice or more, hardness of the second laminated structure is high, so that wear resistance of the coated tool is further improved.

In the second laminated structure, the minimum unit of the thickness in which lamination of the layers is repeated is called as "laminating cycle".

For example, in FIG. 1, Layer A2, Layer B2, Layer C2 and Layer D2 which have different compositions are repeatedly laminated from the substrate (1) toward the surface of the coating layer (2). More specifically, these layers are laminated in the order of Layer A2→Layer B2→Layer C2→Layer D2→Layer A2→Layer B2→Layer C2→Layer D2→ . . . . In this case, the total thickness from Layer A2 to Layer D2 is a "laminating cycle".

For example, Layer A2 and Layer B2 which have different compositions are repeatedly laminated from the substrate (1) toward the surface of the coating layer (2). More specifically, these layers are laminated in the order of Layer A2→Layer B2→Layer A2→Layer B2→Layer A2→Layer B2→ . . . . In this case, total of the thickness of Layer A2 and the thickness of Layer B2 is a "laminating cycle".

To form the second laminated structure, at least two kinds of layers having different compositions are periodically laminated. The average thickness of the respective layers is 2 nm or more and less than 60 nm. By the second laminated structure being thus formed, hardness of the second laminated structure becomes high whereby wear resistance of the coated tool improves. Such an effect can be more heightened by alternately laminating two layers having different compositions twice or more. More specifically, it is preferred that Layer A2 and Layer B2 having different compositions are alternately laminated twice or more from the substrate toward the surface of the coating layer. That is, the second laminated structure preferably contains an alternately laminated structure of Layer A2→Layer B2→Layer A2→Layer B2→ . . . .

If the average thickness of the respective layers contained in the second laminated structure is less than 2 nm, it is difficult to form a layer having a uniform thickness. If the average thickness of the respective layers contained in the second laminated structure is 60 nm or more, hardness of the second laminated structure is lowered, so that wear resistance of the coated tool is lowered. Further, in this case, difference between the thickness of the second laminated structure and the thickness of the first laminated structure becomes small. As a result, cracks to the direction parallel to the boundary surface of the first laminated structure and the second laminated structure do not propagate, whereby propagation of the cracks to the substrate cannot sufficiently be suppressed. Therefore, the average thickness of the respective layers contained in the second laminated structure is 2 nm or more and less than 60 nm. The average thickness of the respective layers contained in the second laminated structure is preferably 5 nm or more and 30 nm or less.

If the average thickness of the second laminated structure is less than 0.02 μm, a number (a number of repeated times) of periodically laminating the layers having different compositions becomes small. In this case, the effect of improving hardness of the second laminated structure cannot be obtained. On the other hand, if the average thickness of the second laminated structure exceeds 6 μm, residual compressive stress of the second laminated structure becomes high. As a result, peeling or fracture of the coating layer likely occurs, whereby fracture resistance of the coated tool is lowered. Accordingly, the average thickness of the second laminated structure is preferably 0.02 to 6 μm.

The coated tool of the present invention contains a coating layer. The coating layer contains the first laminated structure excellent in fracture resistance and the second laminated structure excellent in wear resistance. Accordingly, the coated tool of the present invention is excellent in fracture resistance and wear resistance. The coating layer may contain an upper layer. The upper layer is a layer positioned at the surface side of the coating layer than the first laminated structure and the second laminated structure. The surface side of the coating layer means a side of the coating layer positioned opposite to the substrate. In addition, the coating layer may contain a lower layer. The lower layer is a layer positioned at the substrate side than the first laminated structure and the second laminated structure.

Constitutions of the upper layer and the lower layer are not particularly limited. The upper layer and the lower layer preferably contain at least one metal element selected from the group consisting of Ti, Zr, Hf, V, Nb, Ta, Cr, Mo, W, Al, Si, Sr, Y, Sn and Bi. Further, the upper layer and the lower layer preferably contain a compound comprising at least one kind of a metal element selected from these metal elements and at least one non-metal element selected from the group consisting of carbon, nitrogen, oxygen and boron. Constitutions of the upper layer and the lower layer are preferably a monolayer or a non-periodical multi-layer. When the upper layer and the lower layer have such a constitution, wear resistance of the upper layer and the lower layer is improved.

The first laminated structure and the second laminated structure are preferably laminated two or more alternately and continuously. If the first laminated structure and the second laminated structure are alternately laminated, cracks are likely propagated to the direction parallel to the boundary surface of the first laminated structure and the second laminated structure. As a result, propagation of the cracks to the substrate can be suppressed, whereby fracture resistance of the coated tool is improved.

Positional relationship of the first laminated structure and the second laminated structure is not particularly limited. The positional relationship of the first laminated structure and the second laminated structure are, for example, any of the following (1) to (4).
(1) The first laminated structure is nearest to the substrate, and the second laminated structure is nearest to the surface of the coating layer.
(2) The second laminated structure is nearest to the substrate, and the first laminated structure is nearest to the surface of the coating layer.
(3) The first laminated structure is nearest to the substrate, and is nearest to the surface of the coating layer.
(4) The second laminated structure is nearest to the substrate, and is nearest to the surface of the coating layer.

In the above-mentioned (1) to (4), "the surface of the coating layer" means a surface of the coating layer positioned opposite to the substrate.

Among the above-mentioned positional relationship, (1) is preferred. When the positional relationship of the first laminated structure and the second laminated structure is the above-mentioned (1), residual compressive stress of the first laminated structure is lower than residual compressive stress of the second laminated structure, so that peeling resistance of the coating layer tends to be improved.

The average thickness of the first laminated structure and/or the second laminated structure is continuously or stepwisely reduced from the substrate side toward the surface side of the coating layer. This is because fracture resistance can be improved without lowering wear resistance of the coating layer.

At the surface side of the coating layer, the average thickness(es) of the first laminated structure and/or the second laminated structure is/are decreased, so that a distance between boundary surfaces of the first laminated structures and the second laminated structures becomes short. When the distance between boundary surfaces of the first laminated structure and the second laminated structure becomes short, cracks are likely propagated to the direction parallel to the boundary surface of the first laminated structure and the second laminated structure. As a result, an effect of suppressing propagation of the cracks to the substrate can be obtained as well as fracture resistance is improved. Therefore, if the average thickness of either of the first laminated structure or the second laminated structure is made thin, fracture resistance is improved. If both of the average thicknesses of the first laminated structure and the second laminated structure are made thin, fracture resistance is further improved.

In the present invention, "continuously reduced" means, for example, that the thickness(es) of the first laminated structure and/or the second laminated structure is/are reduced from the substrate side toward the surface side with a certain regularity such as a proportional relationship. However, "continuously reduced" is not limited only to the case where the thickness(es) of the first laminated structure and/or the second laminated structure is/are reduced in accordance with the proportional relationship. For example, "continuously reduced" includes the case where the thickness(es) of the first laminated structure and/or the second laminated structure is/are reduced in accordance with the relation of inverse proportion or exponential relationship. In addition, "continuously reduced" also includes the case where the thickness tends to be reduced from the substrate side toward the surface side. This is because, even in this case, the effect of the present invention can be obtained. For example, the case where a part of the thickness of the coating layer is slightly increased from the substrate side toward the surface side is also included in the scope of the right of the present invention.

In the present invention, "stepwisely reduced" means, for example, that the thickness(es) of the first laminated structure and/or the second laminated structure is/are reduced irregularly from the substrate side toward the surface side. For example, "stepwisely reduced" includes the case where the thickness of the first laminated structure and/or the second laminated structure at the outermost surface alone is/are reduced. In addition, "stepwisely reduced" also includes the case where the thickness tends to be reduced from the substrate side toward the surface side. This is because, even in this case, the effect of the present invention can be obtained. For example, the case where a part of the thickness of the coating layer is slightly increased from the substrate side toward the surface side is also included in the scope of the right of the present invention.

When the average thickness of the first laminated structure nearest to the surface of the coating layer is made TA1, and the average thickness of the first laminated structure nearest to the substrate is made TB1, then a ratio of TA1 to TB1 ((TA1/TB1)×100) is preferably 5% or more and 50% or less, more preferably 5% or more and 30% or less. If the ratio of TA1 to TB1 is less than 5%, the effect of suppressing propagation of the cracks to the substrate may be lowered. On the other hand, if the ratio of TA1 to TB1 exceeds 50%, the effect of suppressing propagation of the cracks to the substrate may be lowered.

When the average thickness of the second laminated structure nearest to the surface of the coating layer is made TA2, and the average thickness of the second laminated structure nearest to the substrate is made TB2, then a ratio of TA2 to TB2 ((TA2/TB2)×100) is preferably 5% or more and 50% or less, more preferably 5% or more and 30% or less. If the ratio of TA2 to TB2 is less than 5%, the effect of suppressing propagation of the cracks to the substrate may be lowered. Further, wear resistance is also lowered in some cases. On the other hand, if the ratio of TA2 to TB2 exceeds 50%, the effect of suppressing propagation of the cracks to the substrate may be lowered.

The average thickness of the respective layers constituting the first laminated structure and the second laminated structure is preferably reduced continuously or stepwise from the substrate side toward the surface side of the coating layer. This is because lowering in wear resistance can be suppressed, whereby fracture resistance is improved.

In the present invention, "continuously reduced" means, for example, that the average thickness of the respective layers constituting the first laminated structure and/or the second laminated structure are reduced from the substrate side toward the surface side with a certain regularity such as a proportional relationship. However, "continuously reduced" is not limited only to the case where the average thickness of the respective layers constituting the first laminated structure and/or the second laminated structure is reduced in accordance with the proportional relationship. For example, "continuously reduced" includes the case where the thicknesses of the respective layers are reduced in accordance with the relation of inverse proportion or exponential relationship. In addition, "continuously reduced" also includes the case where the thickness tends to be reduced from the substrate side toward the surface side. This is because, even in this case, the effect of the present invention can be obtained. For example, the case where a part of the thickness of the coating layer is slightly increased from the substrate side toward the surface side is also included in the scope of the right of the present invention.

In the present invention, "stepwisely reduced" means, for example, that the thicknesses of the respective layers constituting the first laminated structure and/or the second laminated structure are reduced irregularly from the substrate side toward the surface side. For example, "stepwisely reduced" includes the case where the thicknesses of the respective layers constituting the first laminated structure and/or the second laminated structure at the outermost surface alone are reduced. In addition, "stepwisely reduced" also includes the case where the thickness tends to be reduced from the substrate side toward the surface side. This is because, even in this case, the effect of the present invention can be obtained. For example, the case where a part of the thickness of the coating layer is slightly increased from the substrate side toward the surface side is also included in the scope of the right of the present invention.

When the average thickness of the layers contained in the first laminated structure nearest to the surface of the coating layer is made TC1, and the average thickness of the layers contained in the first laminated structure nearest to the substrate is made TD1, then a ratio of TC1 to TD1 ((TC1/TD1)×100) is preferably 12% or more and 70% or less, more preferably 30% or more and 60% or less. If the ratio of TC1 to TD1 is less than 12%, hardness of the surface side of the coating layer becomes high, whereby fracture resistance tends to be lowered. On the other hand, if the ratio of TC1 to TD1 exceeds 70%, wear resistance of the surface side of the coating layer tends to be lowered.

Incidentally, "the average thickness of the layers contained in the first laminated structure" is a value obtained as follows.

For example, when Layer A1 and Layer B1 are laminated in this order repeating 100 times as Layer A1→Layer B1→Layer A1→Layer B1→Layer A1→Layer B1→ . . . , the sum of the laminating cycles repeated 100 times is obtained. Next, a value in which the sum of the laminating cycles is divided by 100 which is a number of the times repeated is obtained. This value is "the average thickness of the layers contained in the first laminated structure". That is, when the first laminated structure comprises "Layer A1→Layer B1→Layer A1→Layer B1→Layer A1→Layer B1→ . . . ", the average thickness of "Layer A1→Layer B1" is "the average thickness of the layers contained in the first laminated structure".

When the average thickness of the layers contained in the second laminated structure nearest to the surface of the coating layer is made TC2, and the average thickness of the layers contained in the second laminated structure nearest to the substrate is made TD2, then a ratio of TC2 to TD2 ((TC2/TD2)×100) is preferably 5% or more and 70% or less, more preferably 30% or more and 60% or less. If the ratio of TC2 to TD2 is less than 5%, hardness of the surface side of the coating layer becomes high, whereby fracture resistance tends to be lowered. On the other hand, if the ratio of TC2 to TD2 exceeds 70%, wear resistance of the surface side of the coating layer tends to be lowered.

Incidentally, "the average thickness of the layers contained in the second laminated structure" is a value obtained as follows.

For example, when Layer A2 and Layer B2 are laminated in this order repeating 100 times as Layer A2→Layer B2→Layer A2→Layer B2→Layer A2→Layer B2→ . . . , the sum of the laminating cycles repeated 100 times is obtained. Next, a value in which the sum of the laminating cycles is divided by 100 which is a number of the times repeated is obtained. This value is "the average thickness of the layers contained in the second laminated structure". That is, when the second laminated structure comprises "Layer A2→Layer B2→Layer A2→Layer B2→Layer A2→Layer B2→ . . . ", the average thickness of "Layer A2→Layer B2" is "the average thickness of the layers contained in the second laminated structure".

A process for preparing the coating layer in the coated tool of the present invention is not particularly limited. For example, the coating layer can be prepared by the physical vapor deposition method such as the ion plating method, the arc ion plating method, the sputtering method and the ion mixing method, etc. For example, the first laminated structure and the second laminated structure explained above can be formed on the substrate by the physical vapor deposition method. In particular, the coating layer formed by the arc ion plating method has high adhesiveness to the substrate. Accordingly, among these methods, the arc ion plating method is preferred.

The respective layers can be formed onto the surface of the substrate by the conventional coating method. According to the above, the coated tool of the present invention can be prepared.

The process for preparing the coated tool of the present invention is, for example, as follows.

A substrate processed to a tool shape is charged in a reaction vessel of a physical vapor deposition device. Next, inside the reaction vessel is evacuated until a pressure becomes $1\times10^{-2}$ Pa or lower. After evacuation, the substrate is heated to 200 to 800° C. by a heater in the reaction vessel. After heating, an Ar gas is introduced into the reaction vessel, and the pressure is made 0.5 to 5.0 Pa. Under the Ar gas atmosphere with the pressure of 0.5 to 5.0 Pa, a bias voltage with −200 to −1000V is applied to the substrate. A current with 5 to 20 A is passed through the tungsten filament in the reaction vessel. The surface of substrate is subjected to an ion bombardment treatment by an Ar gas. After the surface of the substrate is subjected to the ion bombardment treatment, the reaction vessel is evacuated so that a pressure inside thereof becomes $1\times10^{-2}$ Pa or lower.

Then, a reaction gas such as a nitrogen gas, etc., is introduced into the reaction vessel. By making the pressure in the reaction vessel 0.5 to 5.0 Pa, a bias voltage with −10 to −150V is applied to the substrate. By evaporating the metal evaporation sources depending on the metal components of the respective layers by an arc discharge, the respective layers can be formed onto the surface of the substrate. Incidentally, two or more kinds of metal evaporation sources placed in a position apart from each other are evaporated by an arc discharge, and the table onto which a substrate has been fixed is rotated to form a layer constituting the first laminated structure or the second laminated structure. In this case, by adjusting a rotation number of the table onto which the substrate has been fixed in the reaction vessel, the thicknesses of the respective layers constituting the first laminated structure or the second laminated structure can be controlled. By alternately evaporating two or more kinds of metal evaporation sources by an arc discharge, a layer constituting the first laminated structure or the second laminated structure can be also formed. In this case, by adjusting arc discharge times of the metal evaporation sources respectively, the thicknesses of the respective layers constituting the first laminated structure or the second laminated structure can be controlled.

The thicknesses of the respective layers constituting the coating layer and the thicknesses of the respective laminated structures can be measured by observing the cross-sectional structure of the coated tool. For example, the thicknesses of the respective layers constituting the coating layer and the thicknesses of the respective laminated structures can be measured by using optical microscope, scanning electron microscope (SEM), transmission electron microscope (TEM), etc.

The average thicknesses of the respective layers constituting the coating layer and the average thicknesses of the respective laminated structures can be obtained as follows.

At the position nearer to 50 μm from the cutting edge of the surface opposed to the metal evaporation sources toward the center portion of said surface, the cross-sectional surface of the coated tool is observed at the three portions or more. From the observed cross-sectional surface, thicknesses of the respective layers and thicknesses of the respective laminated structure are measured. By calculating the average value of the measured thicknesses, the average thickness can be obtained.

The compositions of the respective layers of the coated tool of the present invention can be measured from the cross-sectional structure of the coated tool by using an energy dispersive X-ray spectrometry (EDS) or a wavelength dispersive X-ray spectrometry (WDS), etc.

A kind of the coated tool of the present invention may be specifically a tool for milling or turning. Examples of such a tool may be an indexable cutting insert, a drill and an end mill.

Example 1

A cemented carbide corresponding to P10 with an ISO standard SEEN1203AGTN insert shape was prepared as the substrate. In the reaction vessel of an arc ion plating device, metal evaporation sources which became the compositions of the respective layers shown in Table 1 and Table 2 were arranged. The prepared substrate was fixed to fixing metal fitting of a rotary table in the reaction vessel.

Thereafter, inside the reaction vessel was evacuated until the pressure therein became $5.0\times10^{-3}$ Pa or lower. After evacuation, the substrate was heated by a heater in the reaction vessel until the temperature thereof became 500° C. After heating, an Ar gas was introduced into the reaction vessel so that the pressure in the reaction vessel became 5.0 Pa.

At an Ar gas atmosphere with a pressure of 5.0 Pa, a bias voltage with −1,000V was applied to the substrate. A current of 10 A was passed through the tungsten filament in the reaction vessel. Under such conditions, the ion bombardment treatment by an Ar gas was carried out for 30 minutes to the surface of the substrate. After completion of the ion bombardment treatment, inside the reaction vessel was evacuated until the pressure in the reaction vessel became $5.0\times10^{-3}$ Pa or lower.

After evacuation, a nitrogen gas was introduced into the reaction vessel, and inside the reaction vessel was made a nitrogen gas atmosphere with a pressure of 2.7 Pa. A bias voltage of −50V was applied to the substrate. The respective layers were formed by evaporating the metal evaporation sources by an arc discharge with an arc current of 200 A.

When Layer A1 and Layer B1 of Present products 1 to 9 and Comparative products 1 and 2 were to be formed, the metal evaporation sources of Layer A1 and the metal evaporation sources of Layer B1 were alternately evaporated by an arc discharge to form Layer A1 and Layer B1. At this time, the respective arc discharge times were so adjusted that Layer A1 and Layer B1 have the thicknesses shown in Table 3. In Comparative product 3 having a thick thickness of the layer, the metal evaporation sources of Layer X and the metal evaporation sources of Layer Y were similarly evaporated by the arc discharge alternately to form Layer X and Layer Y. At this time, the thickness of Layer X and the thickness of Layer Y were controlled by adjusting the arc discharge time at the time of forming the respective layers.

When Layer A2 and Layer B2 of Present products 1 to 9 and Comparative products 1 and 2 were to be formed, the metal evaporation sources of Layer A2 and the metal evaporation sources of Layer B2 were evaporated by an arc discharge simultaneously to form Layer A2 and Layer B2. At this time, the number of rotation of the table was adjusted within the range of 0.2 to 10 $min^{-1}$ so that Layer A2 and Layer B2 have the thicknesses shown in Table 3. In Comparative product 4 having a thin thickness of the layer, the metal evaporation sources of Layer X and the metal evaporation sources of Layer Y were similarly evaporated by the arc discharge simultaneously to form Layer X and Layer Y. At this time, the thickness of Layer X and the thickness of Layer Y were controlled by adjusting the number of rotation of the table within the range of 0.2 to 10 $min^{-1}$.

Comparative product 5 is constituted by layers having a thin thickness and layers having a thick thickness alternately laminated. The thicknesses of the layers constituting Comparative product 5 were controlled by adjusting the arc discharge time and the number of rotation of the table. The number of rotation of the table was adjusted within the range of 0.2 to 10 $min^{-1}$. The monolayer of Comparative product 6 was formed by evaporating the metal evaporation sources by an arc discharge with an arc current of 200 A while applying a bias voltage of −50V to the substrate.

The respective layers were formed onto the surface of the substrate until the layers became predetermined thicknesses shown in Table 3 and Table 4. Thereafter, a power of the heater was turned off, and after the temperature of the sample became 100° C. or lower, the sample was taken out from the reaction vessel.

TABLE 1

| Sample No. | First laminated structure | | Second laminated structure | |
|---|---|---|---|---|
| | LAYER A1 Composition | LAYER B1 Composition | LAYER A2 Composition | LAYER B2 Composition |
| Present product 1 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 2 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 3 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 4 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 5 | $(Ti_{0.50}Al_{0.50})N$ | $(Ti_{0.33}Al_{0.67})N$ | $(Ti_{0.50}Al_{0.50})N$ | $(Ti_{0.33}Al_{0.67})N$ |
| Present product 6 | $(Ti_{0.50}Al_{0.50})N$ | $(Ti_{0.33}Al_{0.67})N$ | $(Ti_{0.50}Al_{0.50})N$ | $(Ti_{0.33}Al_{0.67})N$ |
| Present product 7 | $(Ti_{0.67}Al_{0.33})N$ | $(Ti_{0.33}Al_{0.67})N$ | $(Ti_{0.67}Al_{0.33})N$ | $(Ti_{0.33}Al_{0.67})N$ |
| Present product 8 | $(Ti_{0.67}Al_{0.33})N$ | $(Ti_{0.33}Al_{0.67})N$ | $(Ti_{0.67}Al_{0.33})N$ | $(Ti_{0.33}Al_{0.67})N$ |
| Present product 9 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Comparative product 1 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Comparative product 2 | $(Ti_{0.67}Al_{0.33})N$ | $(Ti_{0.33}Al_{0.67})N$ | $(Ti_{0.67}Al_{0.33})N$ | $(Ti_{0.33}Al_{0.67})N$ |

TABLE 2

| | Coating layer | | | | |
|---|---|---|---|---|---|
| | Alternate laminate | | | | |
| | | | Average thickness | | |
| | Composition | | LAYER X | LAYER Y | LAYER X and LAYER Y Repeated times | Total thickness |
| Sample No. | LAYER X | LAYER Y | (nm) | (nm) | (times) | (µm) |
| Comparative product 3 | $(Ti_{0.50}Al_{0.50})N$ | $(Ti_{0.67}Al_{0.33})N$ | 100 | 100 | 20 | 4.00 |
| Comparative product 4 | $(Ti_{0.67}Al_{0.33})N$ | $(Ti_{0.50}Al_{0.50})N$ | 10 | 10 | 200 | 4.00 |
| Comparative product 5 | $(Ti_{0.67}Al_{0.33})N$ | $(Ti_{0.33}Al_{0.67})N$ | 10 | 100 | 40 | 4.40 |
| Comparative product 6 | $(Ti_{0.50}Al_{0.50})N$ Monolayer | | | | | 4.00 |

TABLE 3

| Sample No. | First laminated structure | | Second laminated structure | |
|---|---|---|---|---|
| | LAYER A1 Average thickness (nm) | LAYER B1 Average thickness (nm) | LAYER A2 Average thickness (nm) | LAYER B2 Average thickness (nm) |
| Present product 1 | 100 | 100 | 10 | 10 |
| Present product 2 | 60 | 60 | 2 | 2 |
| Present product 3 | 250 | 250 | 10 | 10 |
| Present product 4 | 100 | 100 | 55 | 55 |
| Present product 5 | 300 | 300 | 50 | 50 |
| Present product 6 | 200 | 200 | 2 | 2 |
| Present product 7 | 100 | 100 | 10 | 10 |
| Present product 8 | 80 | 80 | 2 | 2 |
| Present product 9 | 150 | 150 | 30 | 30 |
| Comparative product 1 | 100 | 100 | 10 | 10 |
| Comparative product 2 | 200 | 200 | 2 | 2 |

TABLE 4

| Sample No. | Coating layer ||||||||
|---|---|---|---|---|---|---|---|---|
| | First layer (Substrate side) Layer A1 and Layer B1 ||| Second layer Layer A2 and Layer B2 ||| Third layer Layer A1 and Layer B1 |||
| | Laminated structure | Repeated times (times) | Average thickness (μm) TB1 | Laminated structure | Repeated times (times) | Average thickness (μm) TB2 | Laminated structure | Repeated times (times) | Average thickness (μm) |
| Present product 1 | First | 6 | 1.20 | Second | 50 | 1.00 | First | 4 | 0.80 |
| Present product 2 | First | 8 | 0.96 | Second | 250 | 1.00 | First | 6 | 0.72 |
| Present product 3 | First | 4 | 2.00 | Second | 50 | 1.00 | First | 2 | 1.00 |
| Present product 4 | First | 6 | 1.20 | Second | 20 | 2.20 | First | 4 | 0.80 |
| Present product 5 | First | 8 | 4.80 | Second | 30 | 3.00 | First | 4 | 2.40 |
| Present product 6 | First | 15 | 6.00 | Second | 120 | 0.48 | First | 4 | 1.60 |
| Present product 7 | First | 6 | 1.20 | Second | 300 | 6.00 | First | 2 | 0.40 |
| Present product 8 | First | 8 | 1.28 | Second | 8 | 0.03 | First | 2 | 0.32 |
| Present product 9 | First | 10 | 3.00 | Second | 10 | 0.60 | First | 3 | 0.90 |
| Comparative product 1 | First | 5 | 1.00 | Second | 50 | 1.00 | First | 5 | 1.00 |
| Comparative product 2 | First | 3 | 1.20 | Second | 50 | 0.20 | First | 3 | 1.20 |

| Sample No. | Coating layer |||||||| |
|---|---|---|---|---|---|---|---|---|---|
| | Fourth layer Layer A2 and Layer B2 || Fifth layer Layer A1 and Layer B1 ||| Sixth layer (Surface side) Layer A2 and Layer B2 ||| Total thickness (μm) |
| | Laminated structure | Repeated times (times) | Average thickness (μm) | Laminated structure | Repeated times (times) | Average thickness (μm) TA1 | Laminated structure | Repeated times (times) | Average thickness (μm) TA2 | |
| Present product 1 | Second | 30 | 0.60 | First | 2 | 0.40 | Second | 10 | 0.20 | 4.20 |
| Present product 2 | Second | 150 | 0.60 | First | 4 | 0.48 | Second | 50 | 0.20 | 3.96 |
| Present product 3 | Second | 20 | 0.40 | — | — | — | — | — | — | 4.40 |
| Present product 4 | Second | 10 | 1.10 | First | 2 | 0.40 | Second | 5 | 0.55 | 6.25 |
| Present product 5 | Second | 15 | 1.50 | — | — | — | — | — | — | 11.70 |
| Present product 6 | Second | 28 | 0.11 | First | 2 | 0.80 | Second | 10 | 0.04 | 9.03 |
| Present product 7 | Second | 70 | 1.40 | — | — | — | — | — | — | 9.00 |
| Present product 8 | Second | 4 | 0.02 | — | — | — | — | — | — | 1.65 |
| Present product 9 | Second | 10 | 0.60 | First | 2 | 0.60 | Second | 10 | 0.60 | 6.30 |
| Comparative product 1 | Second | 50 | 1.00 | First | 5 | 1.00 | Second | 50 | 1.00 | 6.00 |
| Comparative product 2 | Second | 50 | 0.20 | First | 3 | 1.20 | Second | 50 | 0.20 | 4.20 |

*"First" and "Second" at the column of "Laminated structure" mean the first laminated structure and the second laminated structure of the Present product with the corresponding number in Table 1 and Table 2.

TABLE 5

| | First laminated structure | | Second laminated structure | |
|---|---|---|---|---|
| Sample No. | Average thickness Surface side/ Substrate side (%) (TA1/TB1) × 100 | Reduction in average thickness | Average thickness Surface side/ Substrate side (%) (TA2/TB2) × 100 | Reduction in average thickness |
| Present product 1 | 33 | Continuous | 20 | Continuous |
| Present product 2 | 50 | Continuous | 20 | Continuous |
| Present product 3 | 50 | Stepwise | 40 | Stepwise |
| Present product 4 | 33 | Continuous | 25 | Continuous |
| Present product 5 | 50 | Continuous | 50 | Continuous |
| Present product 6 | 13 | Stepwise | 8 | Stepwise |
| Present product 7 | 33 | Stepwise | 23 | Stepwise |
| Present product 8 | 25 | Stepwise | 50 | Stepwise |
| Present product 9 | 20 | Stepwise | 100 | Not reduced |
| Comparative product 1 | 100 | Not reduced | 100 | Not reduced |
| Comparative product 2 | 100 | Not reduced | 100 | Not reduced |

The average thicknesses of the respective layers and the average thickness of the respective laminated structures of the obtained samples were obtained as follows.

Cross-sectional surfaces at the three portions were observed by TEM at the neighbor of the position of 50 μm from the cutting edge at the surface opposed to the metal evaporation sources of the coated tool toward the center portion of said surface. The thicknesses of the respective layers and the thicknesses of the respective laminated structures were measured, and an average value of the measured thicknesses was calculated.

The compositions of the respective layers of the obtained samples were obtained as follows.

The compositions were measured by using EDS at the cross-sectional surface at the position of 50 μm from the cutting edge at the surface opposed to the metal evaporation sources of the coated tool toward the center portion of said surface.

These measured results are also shown in Tables 1 to 4.

Incidentally, compositional ratios of metal elements of the respective layers in Tables 1 to 4 show an atomic ratio of the respective metal elements based on the whole metal elements in the metal compounds constituting the respective layers.

From the average thickness of the first laminated structure shown in Table 4, a ratio of the average thickness of the first laminated structure nearest to the surface of the coating layer based on the average thickness of the first laminated structure nearest to the substrate was obtained. Similarly, from the average thickness of the second laminated structure shown in Table 4, a ratio of the average thickness of the second laminated structure nearest to the substrate based on the average thickness of the second laminated structure nearest to the surface of the coating layer was obtained. These results are shown in Table 5.

By using the obtained samples, the following Cutting test 1 and Cutting test 2 were carried out, and fracture resistance and wear resistance were evaluated. The evaluation results are shown in Table 6.

[Cutting Test 1: Evaluation of Fracture Resistance]
Work piece material: SCM440,
Shape of work piece material: a rectangular parallelepiped with 105 mm×220 mm×60 mm (provided that six holes with a diameter of φ40 mm have been drilled at the surface with 105 mm×220 mm of the rectangular parallelepiped at which face milling processing is to be carried out.)
Cutting speed: 260 m/min,
Feed: 0.4 mm/tooth,
Depth of cut: 2.0 mm,
Cutting width: 105 mm,
Coolant: none,
Cutter effective diameter: φ125 mm,
Evaluation item: A processed length until the sample had been defected (defect is generated at the cutting blade portion of the sample) was measured as the tool life. A processed length until the sample had fractured was measured.

[Cutting Test 2: Evaluation of Wear Resistance]
Work piece material: SCM440,
Shape of work piece material: a rectangular parallelepiped with 105 mm×220 mm×60 mm,
Cutting speed: 260 m/min,
Feed: 0.12 mm/tooth,
Depth of cut: 2.0 mm,
Cutting width: 50 mm,
Coolant: none,
Cutter effective diameter: φ100 mm,
Evaluation item: A processed length until the maximum flank wear width had become 0.2 mm was the tool life. The processed length until the maximum flank wear width had reached 0.2 mm was measured.

Evaluation standard of the processed length until the tool reaches its tool life in Cutting test 1 is as follows.
⊚: 11 m or more
○: 10.5 m or more and less than 11 m
Δ: 10 m or more and less than 10.5 m
X: Less than 10 m Evaluation standard of the processed length until the tool reaches its tool life in Cutting test 2 is as follows.
⊚: 5 m or more
○: 4.5 m or more and less than 5 m
Δ: 4 m or more and less than 4.5 m
X: Less than 4 m An order of the evaluation is (Excellent) ⊚>○>Δ>X (Poor). The evaluation of ⊚ or ○ means that cutting performance is excellent. The results of the obtained total evaluation are shown in Table 6.

TABLE 6

| | Cutting test 1 Wear resistance test | | Cutting test 2 Fracture resistance test | |
|---|---|---|---|---|
| Sample No. | Tool life (m) | Evaluation | Tool life (m) | Evaluation |
| Present product 1 | 10.2 | Δ | 5.4 | ⊚ |
| Present product 2 | 10.5 | ○ | 5.1 | ⊚ |
| Present product 3 | 10.3 | Δ | 5.3 | ⊚ |
| Present product 4 | 10.5 | ○ | 5.9 | ⊚ |
| Present product 5 | 11.5 | ⊚ | 5.7 | ⊚ |
| Present product 6 | 12.1 | ⊚ | 5.5 | ⊚ |
| Present product 7 | 10.8 | ○ | 6.7 | ⊚ |
| Present product 8 | 12.7 | ⊚ | 4.7 | ○ |
| Present product 9 | 10.7 | ○ | 5.1 | ⊚ |
| Comparative product 1 | 10.3 | Δ | 4.2 | Δ |
| Comparative product 2 | 10.4 | Δ | 3.8 | X |
| Comparative product 3 | 9.7 | X | 3.8 | X |
| Comparative product 4 | 9.6 | X | 3.6 | X |

TABLE 6-continued

|  | Cutting test 1 Wear resistance test | | Cutting test 2 Fracture resistance test | |
|---|---|---|---|---|
| Sample No. | Tool life (m) | Evaluation | Tool life (m) | Evaluation |
| Comparative product 5 | 9.7 | X | 3.7 | X |
| Comparative product 6 | 8.5 | X | 3.3 | X |

From the results of Table 6, the results of the wear resistance test of Present products were Δ or higher. The results of the wear resistance of Present products were equal to those of Comparative products or more in the point of not evaluated to as X. In addition, the results of the fracture resistance test of all the Present products were ⊚ or ○. The results of the fracture resistance test of Comparative products were Δ or x. From these results, it can be understood that Present products are excellent in fracture resistance than Comparative products. From these results, it can be understood that tool lives of Present products are elongated. As can be seen from these results, according to the present invention, fracture resistance could be improved without lowering wear resistance of the coated tool.

Example 2

A cemented carbide corresponding to P10 with an ISO standard SEEN1203AGTN insert shape was prepared as the substrate. In the reaction vessel of an arc ion plating device, metal evaporation sources which became the compositions of the respective layers shown in Table 7 were arranged. According to the same preparation method as in Example 1, the samples having layer constitutions shown in Tables 8 and 9 were prepared.

Present product 10 and Comparative product 10 were prepared as follows.

In the reaction vessel of the arc ion plating device, metal evaporation sources which became the compositions of the respective layers shown in Table 7 were arranged. A mixed gas of an $N_2$ gas and a $CH_4$ gas was introduced into the reaction vessel. A partial pressure ratio of the $N_2$ gas and the $CH_4$ gas in the mixed gas is $N_2:CH_4=1:1$. A pressure in the reaction vessel is 2.7 Pa. The respective layers were prepared in the same manner as in Example 1 except for setting the atmosphere in the reaction vessel as mentioned above, and the samples having layer constitutions shown in Tables 8 and 9 were prepared.

Present product 18 was prepared as follows.

In the reaction vessel of the arc ion plating device, metal evaporation sources which became the compositions of the respective layers shown in Table 7 were arranged. When an oxide layer was to be formed, an $O_2$ gas was introduced into the reaction vessel, and a pressure in the reaction vessel was controlled to 2.7 Pa. Thereafter, when a nitride layer was to be formed, the $O_2$ gas was exhausted from the reaction vessel, an $N_2$ gas was introduced into the reaction vessel, and a pressure in the reaction vessel was controlled to 2.7 Pa. The samples having layer constitutions shown in Tables 8 and 9 were prepared in the same manner as in Example 1 except for setting the atmosphere in the reaction vessel as mentioned above.

TABLE 7

| | First laminated structure | | Second laminated structure | |
|---|---|---|---|---|
| Sample No. | LAYER A1 Composition | LAYER B1 Composition | LAYER A2 Composition | LAYER B2 Composition |
| Present product 10 | $(Ti_{0.50}Al_{0.50})CN$ | $(Ti_{0.67}Al_{0.33})CN$ | $(Ti_{0.50}Al_{0.50})CN$ | $(Ti_{0.67}Al_{0.33})CN$ |
| Present product 11 | $(Ti_{0.50}Al_{0.50})N$ | $(Al_{0.45}Ti_{0.45}Si_{0.10})N$ | $(Ti_{0.50}Al_{0.50})N$ | $(Al_{0.45}Ti_{0.45}Si_{0.10})N$ |
| Present product 12 | $(Ti_{0.50}Al_{0.50})N$ | $(Al_{0.45}Ti_{0.45}Sr_{0.10})N$ | $(Ti_{0.50}Al_{0.50})N$ | $(Al_{0.45}Ti_{0.45}Sr_{0.10})N$ |
| Present product 13 | $(Ti_{0.50}Al_{0.50})N$ | $(Al_{0.45}Ti_{0.45}Y_{0.10})N$ | $(Ti_{0.50}Al_{0.50})N$ | $(Al_{0.45}Ti_{0.45}Y_{0.10})N$ |
| Present product 14 | $(Ti_{0.50}Al_{0.50})N$ | $(Al_{0.50}Ti_{0.30}Cr_{0.20})N$ | $(Ti_{0.50}Al_{0.50})N$ | $(Al_{0.50}Ti_{0.30}Cr_{0.20})N$ |
| Present product 15 | $(Ti_{0.50}Al_{0.50})N$ | $(Al_{0.50}Ti_{0.45}Nb_{0.05})N$ | $(Ti_{0.50}Al_{0.50})N$ | $(Al_{0.50}Ti_{0.45}Nb_{0.05})N$ |
| Present product 16 | $(Ti_{0.67}Al_{0.33})N$ | $(Al_{0.50}Ti_{0.45}Ta_{0.05})N$ | $(Ti_{0.67}Al_{0.33})N$ | $(Al_{0.50}Ti_{0.45}Ta_{0.05})N$ |
| Present product 17 | $(Ti_{0.67}Al_{0.33})N$ | $(Al_{0.50}Ti_{0.45}W_{0.05})N$ | $(Ti_{0.67}Al_{0.33})N$ | $(Al_{0.50}Ti_{0.45}W_{0.05})N$ |
| Present product 18 | $(Al_{0.50}Cr_{0.50})_2O_3$ | $(Ti_{0.90}Si_{0.10})N$ | $(Al_{0.50}Cr_{0.50})_2O_3$ | $(Ti_{0.90}Si_{0.10})N$ |
| Present product 19 | $(Ti_{0.50}Al_{0.50})N$ | $(Al_{0.50}Cr_{0.50})N$ | $(Ti_{0.50}Al_{0.50})N$ | $(Al_{0.50}Cr_{0.50})N$ |
| Present product 20 | TiN | $(Ti_{0.40}Al_{0.30}Cr_{0.20}Si_{0.10})N$ | TiN | $(Ti_{0.40}Al_{0.30}Cr_{0.20}Si_{0.10})N$ |
| Comparative product 7 | $(Ti_{0.50}Al_{0.50})N$ | $(Al_{0.50}Ti_{0.30}Cr_{0.20})N$ | $(Ti_{0.50}Al_{0.50})N$ | $(Al_{0.50}Ti_{0.30}Cr_{0.20})N$ |
| Comparative product 8 | TiN | $(Ti_{0.40}Al_{0.30}Cr_{0.20}Si_{0.10})N$ | TiN | $(Ti_{0.40}Al_{0.30}Cr_{0.20}Si_{0.10})N$ |
| Comparative product 9 | $(Ti_{0.67}Al_{0.33})N$ | $(Ti_{0.90}Si_{0.10})N$ | $(Ti_{0.67}Al_{0.33})N$ | $(Ti_{0.90}Si_{0.10})N$ |
| Comparative product 10 | $(Ti_{0.50}Al_{0.50})CN$ | $(Ti_{0.67}Al_{0.33})CN$ | $(Ti_{0.50}Al_{0.50})CN$ | $(Ti_{0.67}Al_{0.33})CN$ |

TABLE 8

| Sample No. | First laminated structure LAYER A1 Average thickness (nm) | First laminated structure LAYER B1 Average thickness (nm) | Second laminated structure LAYER A2 Average thickness (nm) | Second laminated structure LAYER B2 Average thickness (nm) |
|---|---|---|---|---|
| Present product 10 | 100 | 100 | 10 | 10 |
| Present product 11 | 100 | 100 | 10 | 10 |
| Present product 12 | 100 | 100 | 10 | 10 |
| Present product 13 | 100 | 100 | 10 | 10 |
| Present product 14 | 100 | 100 | 10 | 10 |
| Present product 15 | 100 | 100 | 10 | 10 |
| Present product 16 | 100 | 100 | 10 | 10 |
| Present product 17 | 100 | 100 | 10 | 10 |
| Present product 18 | 100 | 100 | 10 | 10 |
| Present product 19 | 100 | 100 | 10 | 10 |
| Present product 20 | 100 | 100 | 10 | 10 |
| Comparative product 7 | 100 | 100 | 10 | 10 |
| Comparative product 8 | 100 | 100 | 10 | 10 |
| Comparative product 9 | 100 | 100 | 10 | 10 |
| Comparative product 10 | 100 | 100 | 10 | 10 |

TABLE 9

| | Coating layer | | | | | | | |
|---|---|---|---|---|---|---|---|---|
| | First layer (Substrate side) Layer A1 and Layer B1 | | | Second layer Layer A2 and Layer B2 | | | Third layer Layer A1 and Layer B1 | |
| Sample No. | Laminated structure | Repeated times (times) | Average thickness (μm) TB1 | Laminated structure | Repeated times (times) | Average thickness (μm) TB2 | Laminated structure | Repeated times (times) | Average thickness (μm) |
| Present product 10 | First | 6 | 1.20 | Second | 70 | 1.40 | First | 4 | 0.80 |
| Present product 11 | First | 6 | 1.20 | Second | 70 | 1.40 | First | 4 | 0.80 |
| Present product 12 | First | 6 | 1.20 | Second | 70 | 1.40 | First | 4 | 0.80 |
| Present product 13 | First | 6 | 1.20 | Second | 70 | 1.40 | First | 4 | 0.80 |
| Present product 14 | First | 6 | 1.20 | Second | 70 | 1.40 | First | 4 | 0.80 |
| Present product 15 | First | 6 | 1.20 | Second | 70 | 1.40 | First | 4 | 0.80 |
| Present product 16 | First | 6 | 1.20 | Second | 70 | 1.40 | First | 4 | 0.80 |
| Present product 17 | First | 6 | 1.20 | Second | 70 | 1.40 | First | 4 | 0.80 |
| Present product 18 | First | 6 | 1.20 | Second | 70 | 1.40 | First | 4 | 0.80 |
| Present product 19 | First | 4 | 0.80 | Second | 70 | 1.40 | First | 4 | 0.80 |
| Present product 20 | First | 6 | 1.20 | Second | 70 | 1.40 | First | 4 | 0.80 |
| Comparative product 7 | First | 4 | 0.80 | Second | 40 | 0.80 | First | 4 | 0.80 |
| Comparative product 8 | First | 4 | 0.80 | Second | 40 | 0.80 | First | 4 | 0.80 |
| Comparative product 9 | First | 4 | 0.80 | Second | 40 | 0.80 | First | 4 | 0.80 |
| Comparative product 10 | First | 4 | 0.80 | Second | 40 | 0.80 | First | 4 | 0.80 |

TABLE 9-continued

| | Coating layer | | | | | | | | |
|---|---|---|---|---|---|---|---|---|---|
| | Fourth layer | | | Fifth layer<br>Layer A1 and Layer B1 | | | Sixth layer<br>(Surface side)<br>Layer A2 and Layer B2 | | |
| | Layer A2 and Layer B2 | | | | | Average | | | Average |
| Sample No. | Laminated structure | Repeated times (times) | Average thickness (μm) | Laminated structure | Repeated times (times) | thickness (μm) TA1 | Laminated structure | Repeated times (times) | thickness (μm) TA2 | Total thickness (μm) |
| Present product 10 | Second | 40 | 0.80 | First | 2 | 0.40 | Second | 10 | 0.20 | 4.80 |
| Present product 11 | Second | 40 | 0.80 | First | 2 | 0.40 | Second | 10 | 0.20 | 4.80 |
| Present product 12 | Second | 40 | 0.80 | First | 2 | 0.40 | Second | 10 | 0.20 | 4.80 |
| Present product 13 | Second | 40 | 0.80 | First | 2 | 0.40 | Second | 10 | 0.20 | 4.80 |
| Present product 14 | Second | 40 | 0.80 | First | 2 | 0.40 | Second | 10 | 0.20 | 4.80 |
| Present product 15 | Second | 40 | 0.80 | First | 2 | 0.40 | Second | 10 | 0.20 | 4.80 |
| Present product 16 | Second | 40 | 0.80 | First | 2 | 0.40 | Second | 10 | 0.20 | 4.80 |
| Present product 17 | Second | 40 | 0.80 | First | 2 | 0.40 | Second | 10 | 0.20 | 4.80 |
| Present product 18 | Second | 40 | 0.80 | First | 2 | 0.40 | Second | 10 | 0.20 | 4.80 |
| Present product 19 | Second | 40 | 0.80 | First | 4 | 0.80 | Second | 10 | 0.20 | 4.80 |
| Present product 20 | Second | 40 | 0.80 | First | 2 | 0.40 | Second | 10 | 0.20 | 4.80 |
| Comparative product 7 | Second | 40 | 0.80 | First | 4 | 0.80 | Second | 40 | 0.80 | 4.80 |
| Comparative product 8 | Second | 40 | 0.80 | First | 4 | 0.80 | Second | 40 | 0.80 | 4.80 |
| Comparative product 9 | Second | 40 | 0.80 | First | 4 | 0.80 | Second | 40 | 0.80 | 4.80 |
| Comparative product 10 | Second | 40 | 0.80 | First | 4 | 0.80 | Second | 40 | 0.80 | 4.80 |

*"First" and "Second" at the column of "Laminated structure" mean the first laminated structure and the second laminated structure of the Present product with the corresponding number in Table 7 and Table 8.

TABLE 10

| | First laminated structure | | Second laminated structure | |
|---|---|---|---|---|
| Sample No. | Average thickness Surface side/ Substrate side (%) (TA1/TB1) × 100 | Reduction in average thickness | Average thickness Surface side/ Substrate side (%) (TA2/TB2) × 100 | Reduction in average thickness |
| Present product 10 | 33 | Continuous | 14 | Continuous |
| Present product 11 | 33 | Continuous | 14 | Continuous |
| Present product 12 | 33 | Continuous | 14 | Continuous |
| Present product 13 | 33 | Continuous | 14 | Continuous |
| Present product 14 | 33 | Continuous | 14 | Continuous |
| Present product 15 | 33 | Continuous | 14 | Continuous |
| Present product 16 | 33 | Continuous | 14 | Continuous |
| Present product 17 | 33 | Continuous | 14 | Continuous |
| Present product 18 | 33 | Continuous | 14 | Continuous |
| Present product 19 | 100 | Not reduced | 14 | Continuous |
| Present product 20 | 33 | Continuous | 14 | Continuous |
| Comparative product 7 | 100 | Not reduced | 100 | Not reduced |
| Comparative product 8 | 100 | Not reduced | 100 | Not reduced |
| Comparative product 9 | 100 | Not reduced | 100 | Not reduced |
| Comparative product 10 | 100 | Not reduced | 100 | Not reduced |

The average thicknesses of the respective layers and the compositions of the respective layers of the obtained samples were measured in the same manner as in Example 1. These results are shown in Tables 8 to 10. In addition, Cutting test 1 and Cutting test 2 which were the same as in Example 1 were carried out by using the obtained samples to evaluate wear resistance and fracture resistance. The evaluation results are shown in Table 11.

Evaluation standard of the processed length until the tool reaches its tool life in Cutting test 1 is as follows.

◎: 11 m or more
○: 10.5 m or more and less than 11 m
Δ: 10 m or more and less than 10.5 m
X: Less than 10 m Evaluation standard of the processed length until the tool reaches its tool life in Cutting test 2 is as follows.

◎: 5 m or more
○: 4.5 m or more and less than 5 m
Δ: 4 m or more and less than 4.5 m
X: Less than 4 m An order of the evaluation is (Excellent) ◎>○>Δ>x (Poor). The evaluation of ◎ or ○ means that cutting performance is excellent. The results of the obtained total evaluation are shown in Table 11.

TABLE 11

| Sample No. | Cutting test 1 Wear resistance test | | Cutting test 2 Fracture resistance test | |
|---|---|---|---|---|
| | Tool life (m) | Evaluation | Tool life (m) | Evaluation |
| Present product 10 | 10.2 | Δ | 5.5 | ◎ |
| Present product 11 | 10.4 | Δ | 5.3 | ◎ |
| Present product 12 | 10.4 | Δ | 5.3 | ◎ |
| Present product 13 | 10.1 | Δ | 5.6 | ◎ |
| Present product 14 | 10.1 | Δ | 5.3 | ◎ |
| Present product 15 | 10.3 | Δ | 5.4 | ◎ |
| Present product 16 | 10.5 | ○ | 5.1 | ◎ |
| Present product 17 | 10.5 | ○ | 5.2 | ◎ |
| Present product 18 | 10.2 | Δ | 5.3 | ◎ |
| Present product 19 | 10.1 | Δ | 4.9 | ○ |
| Present product 20 | 10.0 | Δ | 5.1 | ◎ |
| Comparative product 7 | 9.8 | X | 4.1 | Δ |
| Comparative product 8 | 9.7 | X | 4.0 | X |
| Comparative product 9 | 9.8 | X | 4.1 | Δ |
| Comparative product 10 | 9.8 | X | 4.1 | Δ |

From the results shown in Table 11, the results of the wear resistance test of Present products were Δ or more. The results of the wear resistance test of Present products were equal to those of Comparative products or more in the point of not evaluated to as X. In addition, the results of the fracture resistance test of all the Present products were ◎ or ○. The results of the fracture resistance test of Comparative products were Δ or X. From these results, it can be understood that Present products are excellent in fracture resistance than Comparative products. From these results, it can be understood that tool lives of Present products is elongated. As can be seen from these results, according to the present invention, fracture resistance could be improved without lowering wear resistance of the coated tool.

Example 3

Present products 21 to 27 and Comparative products 11 to 13 were prepared as follows.

A cemented carbide corresponding to P10 with an ISO standard SEEN1203AGTN insert shape was prepared as the substrate. In the reaction vessel of an arc ion plating device, metal evaporation sources which became the compositions of the respective layers shown in Table 12 and Table 13 were arranged. According to the same preparation method as in Example 1, the samples having layer constitutions shown in Tables 13, 14 and 16 were prepared.

TABLE 12

| Sample No. | First laminated structure | | Second laminated structure | |
|---|---|---|---|---|
| | LAYER A1 Composition | LAYER B1 Composition | LAYER A2 Composition | LAYER B2 Composition |
| Present product 21 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 22 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 23 | $(Ti_{0.50}Al_{0.50})N$ | $(Al_{0.50}Ti_{0.30}Cr_{0.20})N$ | $(Ti_{0.50}Al_{0.50})N$ | $(Al_{0.50}Ti_{0.30}Cr_{0.20})N$ |
| Present product 24 | $(Ti_{0.67}Al_{0.33})N$ | $(Al_{0.50}Ti_{0.45}W_{0.05})N$ | $(Ti_{0.67}Al_{0.33})N$ | $(Al_{0.50}Ti_{0.45}W_{0.05})N$ |
| Present product 25 | $(Al_{0.50}Cr_{0.50})N$ | $(Ti_{0.90}Si_{0.10})N$ | $(Al_{0.50}Cr_{0.50})N$ | $(Ti_{0.90}Si_{0.10})N$ |
| Present product 26 | $(Ti_{0.50}Al_{0.50})N$ | $(Al_{0.50}Ti_{0.45}Nb_{0.05})N$ | $(Ti_{0.50}Al_{0.50})N$ | $(Al_{0.50}Ti_{0.45}Nb_{0.05})N$ |
| Present product 27 | $(Ti_{0.50}Al_{0.50})N$ | $(Ti_{0.40}Al_{0.30}Cr_{0.20}Si_{0.10})N$ | $(Ti_{0.50}Al_{0.50})N$ | $(Ti_{0.40}Al_{0.30}Cr_{0.20}Si_{0.10})N$ |

TABLE 13

| Sample No. | Coating layer Alternately laminated layers - First layer Composition LAYER X | LAYER Y | Average thickness LAYER X (nm) | LAYER Y (nm) | LAYER X and LAYER Y Repeated times (times) | Second layer Average thickness LAYER X (nm) | LAYER Y (nm) |
|---|---|---|---|---|---|---|---|
| Comparative product 11 | $(Ti_{0.50}Al_{0.50})N$ | $(Ti_{0.67}Al_{0.33})N$ | 100 | 100 | 10 | 90 | 90 |
| Comparative product 12 | $(Ti_{0.67}Al_{0.33})N$ | $(Ti_{0.50}Al_{0.50})N$ | 60 | 60 | 22 | 40 | 40 |
| Comparative product 13 | $(Ti_{0.67}Al_{0.33})N$ | $(Ti_{0.33}Al_{0.67})N$ | 60 | 60 | 25 | 40 | 40 |

| Sample No. | Second layer LAYER X and LAYER Y Repeated times (times) | Third layer Average thickness LAYER X (nm) | LAYER Y (nm) | LAYER X and LAYER Y Repeated times (times) | Total thickness (µm) |
|---|---|---|---|---|---|
| Comparative product 11 | 10 | 80 | 80 | 10 | 5.40 |
| Comparative product 12 | 22 | 22 | 20 | 22 | 5.32 |
| Comparative product 13 | 20 | 22 | 20 | 15 | 5.23 |

TABLE 14

| Sample No. | First layer (Substrate side) First laminated structure LAYER A1 Average thickness (nm) TD1 | LAYER B1 Average thickness (nm) | Second layer Second laminated structure LAYER A2 Average thickness (nm) TD2 | LAYER B2 Average thickness (nm) | Third layer First laminated structure LAYER A1 Average thickness (nm) | LAYER B1 Average thickness (nm) | Fourth layer Second laminated structure LAYER A2 Average thickness (nm) | LAYER B2 Average thickness (nm) | Fifth layer First laminated structure LAYER A1 Average thickness (nm) | LAYER B1 Average thickness (nm) TC1 | Sixth layer (Surface side) Second laminated structure LAYER A2 Average thickness (nm) | LAYER B2 Average thickness (nm) TC2 |
|---|---|---|---|---|---|---|---|---|---|---|---|---|
| Present product 21 | 100 | 100 | 30 | 30 | 80 | 80 | 20 | 20 | 60 | 60 | 10 | 10 |
| Present product 22 | 150 | 150 | 30 | 30 | 60 | 60 | 10 | 10 | — | — | — | — |
| Present product 23 | 100 | 100 | 40 | 40 | 80 | 80 | 10 | 10 | 60 | 60 | 2 | 2 |
| Present product 24 | 200 | 200 | 30 | 30 | 80 | 80 | 20 | 20 | 60 | 60 | 10 | 10 |
| Present product 25 | 70 | 70 | 20 | 20 | 65 | 65 | 10 | 10 | 60 | 60 | 5 | 5 |
| Present product 26 | 70 | 70 | 30 | 30 | 70 | 70 | 20 | 20 | 70 | 70 | 10 | 10 |
| Present product 27 | 80 | 80 | 20 | 20 | 60 | 60 | 20 | 20 | 40 | 40 | 20 | 20 |

TABLE 15

| Sample No. | First laminated structure - Average thickness of respective layers Surface side/Substrate side (%) (TC1/TD1) × 100 | First laminated structure - Reduction in average thickness of respective layers | Second laminated structure - Average thickness of respective layers Surface side/Substrate side (%) (TC2/TD2) × 100 | Second laminated structure - Reduction in average thickness of respective layers |
|---|---|---|---|---|
| Present product 21 | 60 | Continuous | 33 | Continuous |
| Present product 22 | 40 | Stepwise | 33 | Stepwise |
| Present product 23 | 60 | Continuous | 5 | Stepwise |
| Present product 24 | 30 | Stepwise | 33 | Continuous |
| Present product 25 | 86 | Continuous | 25 | Stepwise |
| Present product 26 | 100 | Not reduced | 33 | Continuous |
| Present product 27 | 50 | Continuous | 100 | Not reduced |

TABLE 16

| | Coating layer | | | | | | | | |
|---|---|---|---|---|---|---|---|---|---|
| | First layer (Substrate side) Layer A1 and Layer B1 | | | Second layer Layer A2 and Layer B2 | | | Third layer Layer A1 and Layer B1 | | |
| Sample No. | Laminated structure | Repeated times (times) | Average thickness (μm) TB1 | Laminated structure | Repeated times (times) | Average thickness (μm) TB2 | Laminated structure | Repeated times (times) | Average thickness (μm) |
| Present product 21 | First | 6 | 1.20 | Second | 40 | 2.40 | First | 4 | 0.64 |
| Present product 22 | First | 6 | 1.80 | Second | 40 | 2.40 | First | 4 | 0.48 |
| Present product 23 | First | 4 | 0.80 | Second | 40 | 3.20 | First | 3 | 0.48 |
| Present product 24 | First | 8 | 3.20 | Second | 20 | 1.20 | First | 3 | 0.48 |
| Present product 25 | First | 10 | 1.40 | Second | 40 | 1.60 | First | 7 | 0.91 |
| Present product 26 | First | 6 | 0.84 | Second | 40 | 2.40 | First | 4 | 0.56 |
| Present product 27 | First | 6 | 0.96 | Second | 40 | 1.60 | First | 4 | 0.48 |

| | Coating layer | | | | | | | | |
|---|---|---|---|---|---|---|---|---|---|
| | Fourth layer Layer A2 and Layer B2 | | | Fifth layer Layer A1 and Layer B1 | | | Sixth layer (Surface side) Layer A2 and Layer B2 | | |
| Sample No. | Laminated structure | Repeated times (times) | Average thickness (μm) | Laminated structure | Repeated times (times) | Average thickness (μm) TA1 | Laminated structure | Repeated times (times) | Average thickness (μm) TA2 | Total thickness (μm) |
| Present product 21 | Second | 20 | 0.80 | First | 2 | 0.24 | Second | 10 | 0.20 | 5.48 |
| Present product 22 | Second | 20 | 0.40 | — | — | — | — | — | — | 5.08 |
| Present product 23 | Second | 30 | 0.60 | First | 2 | 0.24 | Second | 20 | 0.08 | 5.40 |
| Present product 24 | Second | 15 | 0.60 | First | 2 | 0.24 | Second | 5 | 0.10 | 5.82 |
| Present product 25 | Second | 30 | 0.60 | First | 3 | 0.36 | Second | 20 | 0.20 | 5.07 |
| Present product 26 | Second | 20 | 0.80 | First | 2 | 0.28 | Second | 10 | 0.20 | 5.08 |
| Present product 27 | Second | 35 | 1.40 | First | 2 | 0.16 | Second | 10 | 0.40 | 5.00 |

*"First" and "Second" at the column of "Laminated structure" mean the first laminated structure and the second laminated structure of the Present product with the corresponding number in Table 7 and Table 8.

TABLE 17

| Sample No. | First laminated structure | | Second laminated structure | |
|---|---|---|---|---|
| | Average thickness Surface side/ Substrate side (%) (TA1/TB1) × 100 | Reduction in average thickness | Average thickness Surface side/ Substrate side (%) (TA2/TB2) × 100 | Reduction in average thickness |
| Present product 21 | 20 | Continuous | 8 | Stepwise |
| Present product 22 | 27 | Stepwise | 17 | Stepwise |
| Present product 23 | 30 | Continuous | 3 | Continuous |
| Present product 24 | 8 | Stepwise | 8 | Stepwise |
| Present product 25 | 26 | Stepwise | 13 | Continuous |
| Present product 26 | 33 | Continuous | 8 | Stepwise |
| Present product 27 | 17 | Continuous | 25 | Stepwise |

The average thicknesses of the respective layers and the compositions of the respective layers of the obtained samples were measured in the same manner as in Example 1. These results are shown in Table 12 to 17. In addition, Cutting test 1 and Cutting test 2 which were the same as in Example 1 were carried out by using the obtained samples to evaluate wear resistance and fracture resistance. The evaluation results are shown in Table 18.

Evaluation standard of the processed length until the tool reaches its tool life in Cutting test 1 is as follows.

⊚: 11 m or more
◯: 10.5 m or more and less than 11 m
Δ: 10 m or more and less than 10.5 m
X: Less than 10 m Evaluation standard of the processed length until the tool reaches its tool life in Cutting test 2 is as follows.

⊚: 5 m or more
◯: 4.5 m or more and less than 5 m
Δ: 4 m or more and less than 4.5 m
X: Less than 4 m An order of the evaluation is (Excellent) ⊚>◯>Δ>x (Poor). The evaluation of ⊚ or ◯ means that cutting performance is excellent. The results of the obtained total evaluation are shown in Table 18.

TABLE 18

| | Cutting test 1 Wear resistance test | | Cutting test 2 Fracture resistance test | |
|---|---|---|---|---|
| Sample No. | Tool life (m) | Evaluation | Tool life (m) | Evaluation |
| Present product 21 | 10.1 | Δ | 6.1 | ⊚ |
| Present product 22 | 10.0 | Δ | 6.0 | ⊚ |
| Present product 23 | 10.0 | Δ | 6.0 | ⊚ |
| Present product 24 | 10.3 | Δ | 5.4 | ⊚ |
| Present product 25 | 10.1 | Δ | 5.1 | ⊚ |
| Present product 26 | 10.1 | Δ | 5.5 | ⊚ |
| Present product 27 | 10.1 | Δ | 5.5 | ⊚ |
| Comparative product 11 | 10.0 | Δ | 4.3 | Δ |
| Comparative product 12 | 10.2 | Δ | 4.1 | Δ |
| Comparative product 13 | 10.2 | Δ | 4.3 | Δ |

From the results of Table 18, the results of the wear resistance test of Present products were Δ. The results of the wear resistance test of Present products were equal to those of Comparative products or more in the point of not evaluated to as X. In addition, the results of the fracture resistance test of all the Present products were ⊚. The results of the fracture resistance test of Comparative products were Δ. From these results, it can be understood that Present products are excellent in fracture resistance than Comparative products. From these results, it can be understood that tool lives of Present products are elongated. As can be seen from these results, according to the present invention, fracture resistance could be improved without lowering wear resistance of the coated tool.

Example 4

Present products 28 to 30 were prepared as follows.

A cemented carbide corresponding to P10 with an ISO standard SEEN1203AGTN insert shape was prepared as the substrate. In the reaction vessel of an arc ion plating device, metal evaporation sources which became the compositions of the respective layers shown in Table 19 were arranged. According to the same preparation method as in Example 1, the samples having layer constitutions shown in Table 20 and Table 21 were prepared.

TABLE 19

| | | First laminated structure | | Second laminated structure | | |
|---|---|---|---|---|---|---|
| Sample No. | Lower layer Composition | LAYER A1 Composition | LAYER B1 Composition | LAYER A2 Composition | LAYER B2 Composition | Upper layer Composition |
| Present product 28 | $(Al_{0.50}Ti_{0.30}Cr_{0.20})N$ | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ | $(Al_{0.50}Ti_{0.30}Cr_{0.20})N$ |
| Present product 29 | TiN | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ | — |
| Present product 30 | — | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ | $(Ti_{0.50}Al_{0.50})N$ |

TABLE 20

| Sample No. | First laminated structure | | Second laminated structure | |
|---|---|---|---|---|
| | LAYER A1 Average thickness (nm) | LAYER B1 Average thickness (nm) | LAYER A2 Average thickness (nm) | LAYER B2 Average thickness (nm) |
| Present product 28 | 100 | 100 | 10 | 10 |
| Present product 29 | 60 | 60 | 2 | 2 |
| Present product 30 | 250 | 250 | 10 | 10 |

TABLE 22

| Sample No. | First laminated structure | | Second laminated structure | |
|---|---|---|---|---|
| | Average thickness Surface side/ Substrate side (%) (TA1/TB1) × 100 | Reduction in average thickness | Average thickness Surface side/ Substrate side (%) (TA2/TB2) × 100 | Reduction in average thickness |
| Present product 28 | 33 | Continuous | 20 | Continuous |
| Present product 29 | 50 | Continuous | 20 | Continuous |
| Present product 30 | 50 | Stepwise | 40 | Stepwise |

TABLE 21

| | Coating layer | | | | | | | | | |
|---|---|---|---|---|---|---|---|---|---|---|
| | First layer (Substrate side) Lower layer | Second layer Layer A1 and Layer B1 | | | Third layer Layer A2 and Layer B2 | | | Fourth layer Layer A1 and Layer B1 | | |
| Sample No. | Average thickness (μm) | Laminated structure | Repeated times (times) | Average thickness (μm) TB1 | Laminated structure | Repeated times (times) | Average thickness (μm) TB2 | Laminated structure | Repeated times (times) | Average thickness (μm) |
| Present product 28 | 0.5 | First | 6 | 1.20 | Second | 50 | 1.00 | First | 4 | 0.80 |
| Present product 29 | 0.5 | First | 8 | 0.96 | Second | 250 | 1.00 | First | 6 | 0.72 |
| Present product 30 | 0 | First | 4 | 2.00 | Second | 50 | 1.00 | First | 2 | 1.00 |

| | Coating layer | | | | | | | | | |
|---|---|---|---|---|---|---|---|---|---|---|
| | Fifth layer Layer A2 and Layer B2 | | | Sixth layer Layer A1 and Layer B1 | | | Seventh layer Layer A2 and Layer B2 | | Eighth layer (Surface side) Upper layer | |
| Sample No. | Laminated structure | Repeated times (times) | Average thickness (μm) | Laminated structure | Repeated times (times) | Average thickness (μm) TA1 | Laminated structure | Repeated times (times) | Average thickness (μm) TA2 | Average thickness (μm) | Total thickness (μm) |
| Present product 28 | Second | 30 | 0.60 | First | 2 | 0.40 | Second | 10 | 0.20 | 0.50 | 5.20 |
| Present product 29 | Second | 150 | 0.60 | First | 4 | 0.48 | Second | 50 | 0.20 | 0.00 | 4.46 |
| Present product 30 | Second | 20 | 0.40 | — | — | — | — | — | — | 0.50 | 4.90 |

*"First" and "Second" at the column of "Laminated structure" mean the first laminated structure and the second laminated structure of the Present product with the corresponding number in Table 19 and Table 20.

The average thicknesses of the respective layers and the compositions of the respective layers of the obtained samples were measured in the same manner as in Example 1. These results are shown in Tables 19 to 22. In addition, Cutting test 1 and Cutting test 2 which were the same as in Example 1 were carried out by using the obtained samples to evaluate wear resistance and fracture resistance. The evaluation results are shown in Table 23.

Evaluation standard of the processed length until the tool reaches its tool life in Cutting test 1 is as follows.
◎: 11 m or more
○: 10.5 m or more and less than 11 m
Δ: 10 m or more and less than 10.5 m
X: Less than 10 m Evaluation standard of the processed length until the tool reaches its tool life in Cutting test 2 is as follows.
◎: 5 m or more
○: 4.5 m or more and less than 5 m
Δ: 4 m or more and less than 4.5 m
X: Less than 4 m An order of the evaluation is (Excellent) ◎>○>Δ>x (Poor). The evaluation of ◎ or ○ means that cutting performance is excellent. The results of the obtained total evaluation are shown in Table 23.

TABLE 23

| Sample No. | Cutting test 1 Wear resistance test | | Cutting test 2 Fracture resistance test | |
|---|---|---|---|---|
| | Tool life (m) | Evaluation | Tool life (m) | Evaluation |
| Present product 28 | 10.2 | Δ | 5.3 | ◎ |
| Present product 29 | 10.4 | Δ | 5.1 | ◎ |
| Present product 30 | 10.2 | Δ | 5.4 | ◎ |

From the results of Table 23, the results of the wear resistance test of Present products were Δ. The results of the wear resistance test of Present products did not have X. In addition, the results of the fracture resistance test of all the Present products were ◎. From these results, it can be understood that Present products are excellent in fracture resistance. From these results, it can be understood that Present products are elongated in tool lives whereas these have the lower layer and/or the upper layer. As can be seen from these results, according to the present invention, fracture resistance can be improved without lowering wear resistance of the coated tool.

UTILIZABILITY IN INDUSTRY

According to the present invention, fracture resistance can be improved without lowering wear resistance of the coated tool. According to the present invention, tool life can be elongated than the conventional ones. Accordingly, utilizability in industry of the present invention is high.

EXPLANATION OF REFERENCE NUMERALS

1 Substrate
2 Coating layer
3a First laminated structure in which the thickness is thick at the substrate side
3b First laminated structure in which the thickness is thin at the surface side
4a Second laminated structure in which the thickness is thick at the substrate side
4b Second laminated structure in which the thickness is thin at the surface side
5a Layer A1 in which the thickness is thick at the substrate side
5b Layer A1 in which the thickness is thin at the surface side
6a Layer B1 in which the thickness is thick at the substrate side
6b Layer B1 in which the thickness is thin at the surface side
7a Layer A2 in which the thickness is thick at the substrate side
7b Layer A2 in which the thickness is thin at the surface side
8a Layer B2 in which the thickness is thick at the substrate side
8b Layer B2 in which the thickness is thin at the surface side

What is claimed is:

1. A coated tool which comprises:
a substrate, and
a coating layer formed on a surface of the substrate,
wherein the coating layer contains a first laminated structure and a second laminated structure,
the first laminated structure and the second laminated structure are laminated alternately and continuously twice or more,
the first laminated structure contains at least two kinds of layers having different compositions, and the two kinds of layers are alternately laminated twice or more,
an average thickness of the layers contained in the first laminated structure is 60 nm or more and 500 nm or less,
the second laminated structure contains at least two kinds of layers having different compositions, and the two kinds of layers are alternately laminated twice or more,
an average thickness of the layers contained in the second laminated structure is 2 nm or more and less than 60 nm,
the layers contained in the first laminated structure and the second laminated structure contain a compound comprising:
at least one metal element selected from the group consisting of Ti, Zr, Hf, V, Nb, Ta, Cr, Mo, W, Al, Si, Sr, Y, Sn and Bi, and
at least one non-metal element selected from the group consisting of carbon, nitrogen, oxygen and boron, and
an average thickness(es) of the first laminated structure and/or the second laminated structure is/are continuously or stepwisely reduced from a substrate side toward a surface side of the coating layer,
wherein the average thickness of the first laminated structure is 0.2 μm or more and 6 μm or less,
wherein the average thickness of the second laminated structure is 0.02 μm or more and 6 μm or less,
wherein an average thickness of the coating layer is 0.22 μm or more and 12 μm or less,
wherein an average thickness of the first laminated structure nearest to the surface of the coating layer is given by TA1, and an average thickness of the first laminated structure nearest to the substrate is given by TB1, a ratio of TA1 to TB1 is 5% or more and 50% or less,
wherein an average thickness of the second laminated structure nearest to the surface of the coating layer is given by TA2, and an average thickness of the second laminated structure nearest to the substrate is given by TB2, a ratio of TA2 to TB2 is 5% or more and 50% or less, wherein an average thickness of the layers contained in the first laminated structure nearest to the surface of the coating layer is given by TC1, and an average thickness of the layers contained in the first laminated structure nearest to the substrate is given by TD1, a ratio of TC1 to TD1 is 12% or more and 70% or less, and wherein an average thickness of the layers contained in the second laminated structure nearest to the surface of the coating layer is given by TC2, and an average thickness of the layers contained in the second laminated structure nearest to the substrate is given by TD2, a ratio of TC2 to TD2 is 5% or more and 70% or less.

2. The coated tool according to claim 1, wherein the layers contained in the first laminated structure and the layers contained in the second laminated structure contain:
a compound comprising at least two metal elements selected from the group consisting of Ti, Nb, Ta, Cr, W, Al, Si, Sr and Y, and
at least one non-metal element selected from the group consisting of carbon, nitrogen, oxygen and boron.

3. The coated tool according to claim 1, wherein:
the average thickness of the first laminated structure nearest to the substrate is thicker than the average thickness of the first laminated structure nearest to the surface side of the coating layer;
the average thickness of the second laminated structure nearest to the substrate is thicker than the average thickness of the second laminated structure nearest to the surface side of the coating layer;
the total number of layers in each of the first laminated structures decreases, with increasing distance from the substrate;
the total number of layers in each of the second laminated structures decreases, with increasing distance from the substrate; and
the total number of layers in any of the first laminated structures is less than the total number of layers in any of the second laminated structures.

4. A coated tool which comprises:
a substrate, and
a coating layer formed on a surface of the substrate,
wherein the coating layer contains a first laminated structure and a second laminated structure,
the first laminated structure and the second laminated structure are laminated alternately and continuously twice or more,
the first laminated structure contains at least two kinds of layers having different compositions, and the two kinds of layers are alternately laminated twice or more,
an average thickness of the layers contained in the first laminated structure is 60 nm or more and 500 nm or less,
the second laminated structure contains at least two kinds of layers having different compositions, and the two kinds of layers are alternately laminated twice or more,
an average thickness of the layers contained in the second laminated structure is 2 nm or more and less than 60 nm,
the layers contained in the first laminated structure and the second laminated structure contain a compound comprising:
at least one metal element selected from the group consisting of Ti, Zr, Hf, V, Nb, Ta, Cr, Mo, W, Al, Si, Sr, Y, Sn and Bi, and
at least one non-metal element selected from the group consisting of carbon, nitrogen, oxygen and boron,
an average thickness of the first laminated structure nearest to the substrate is thicker than an average thickness of the first laminated structure nearest to a surface of the coating layer; and
an average thickness of the second laminated structure nearest to the substrate is thicker than an average thickness of the second laminated structure nearest to the surface of the coating layer,
wherein the average thickness of the first laminated structures is 0.2 µm or more and 6 µm or less,
wherein the average thickness of the second laminated structures is 0.02 µm or more and 6 µm or less,
wherein an average thickness of the coating layer is 0.22 µm or more and 12 µm or less,
wherein the average thickness of the first laminated structure nearest to the surface of the coating layer is given by TA1, and the average thickness of the first laminated structure nearest to the substrate is given by TB1, a ratio of TA1 to TB1 is 5% or more and 50% or less,
wherein the average thickness of the second laminated structure nearest to the surface of the coating layer is given by TA2, and the average thickness of the second laminated structure nearest to the substrate is given by TB2, a ratio of TA2 to TB2 is 5% or more and 50% or less,
wherein an average thickness of the layers contained in the first laminated structure nearest to the surface of the coating layer is given by TC1, and an average thickness of the layers contained in the first laminated structure nearest to the substrate is given by TD1, a ratio of TC1 to TD1 is 12% or more and 70% or less, and
wherein an average thickness of the layers contained in the second laminated structure nearest to the surface of the coating layer is given by TC2, and an average thickness of the layers contained in the second laminated structure nearest to the substrate is given by TD2, a ratio of TC2 to TD2 is 5% or more and 70% or less.

5. The coated tool according to claim 4, wherein:
at least three first laminated structures and at least three second laminated structure are laminated alternately; and
the total number of layers in each of the first laminated structures decreases, with increasing distance from the substrate; and
the total number of layers in each of the second laminated structures decreases, with increasing distance from the substrate.

6. The coated tool according to claim 5, wherein:
the total number of layers in any of the first laminated structures is less than the total number of layers in any of the second laminated structures.

* * * * *